United States Patent
Lee et al.

(10) Patent No.: US 9,350,324 B2
(45) Date of Patent: May 24, 2016

(54) MCML RETENTION FLIP-FLOP/LATCH FOR LOW POWER APPLICATIONS

(71) Applicant: Taiwan Semiconductor Manufacturing Co., Ltd., Hsin-Chu (TW)

(72) Inventors: Tsung-Hsiung Lee, New Taipei (TW); Shi-Hung Wang, Houli Township (TW); Kuang-Kai Yen, Kaohsiung (TW); Wei-Li Chen, Hsinchu (TW); Yung-Hsu Chuang, Hsinchu (TW); Shih-Hung Lan, Jhubei (TW); Fan-ming Kuo, Zhubei (TW); Chewn-Pu Jou, Hsinchu (TW); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 190 days.

(21) Appl. No.: 13/727,850

(22) Filed: Dec. 27, 2012

(65) Prior Publication Data
US 2014/0184296 A1 Jul. 3, 2014

(51) Int. Cl.
*H03K 3/00* (2006.01)
*H03K 3/012* (2006.01)
*H03K 3/3562* (2006.01)
*H03K 3/356* (2006.01)

(52) U.S. Cl.
CPC ............. *H03K 3/012* (2013.01); *H03K 3/3562* (2013.01); *H03K 3/356008* (2013.01); *H03K 3/356043* (2013.01)

(58) Field of Classification Search
CPC ................ H03K 3/012; H03K 3/0375; H03K 3/356121; H03K 3/356139; H03K 3/35625
See application file for complete search history.

(56) References Cited

U.S. PATENT DOCUMENTS

| | | | | |
|---|---|---|---|---|
| 5,369,311 A * | 11/1994 | Wang et al. | | 327/292 |
| 7,187,222 B2 * | 3/2007 | Meltzer et al. | | 327/202 |
| 7,453,300 B2 * | 11/2008 | Won et al. | | 327/218 |
| 7,768,329 B2 * | 8/2010 | Kimura | | 327/199 |
| 7,872,514 B2 * | 1/2011 | Chee | | 327/218 |
| 7,888,991 B2 * | 2/2011 | Lin | | 327/538 |

(Continued)

OTHER PUBLICATIONS

Badel, et al. "Semi-Automated Design of a MOS Current Mode Logic Standard Cell Library From Generic Components." IEEE Research in Microelectronics and Electronics, 2005 PhD (Vol. 2 ). Jul. 25-28 2005.

(Continued)

*Primary Examiner* — Sibin Chen
(74) *Attorney, Agent, or Firm* — Eschweiler & Associates, LLC

(57) ABSTRACT

The present disclosure relates to a device and method to reduce the dynamic/static power consumption of an MCML logic device. In order to retain register contents during power off mode, an MCML retention latch and flip-flop are disclosed. Retention Latch circuits in MCML architecture are used to retain critical register contents during power off mode, wherein combination logic including clock buffers on the clock tree paths are powered off to reduce dynamic/static power consumption. The MCML retention flip-flop comprises a master latch and a slave latch, wherein a power switch is added to the master latch to power the master latch off during power off mode. The slave latch includes pull-down circuits that remain active to enable the slave latch to retain data at a proper voltage level during power off mode. Other devices and methods are also disclosed.

20 Claims, 21 Drawing Sheets

(56) References Cited

U.S. PATENT DOCUMENTS

| | | | |
|---|---|---|---|
| 8,648,654 B1* | 2/2014 | Myers et al. | 327/565 |
| 2004/0179520 A1* | 9/2004 | Fattaruso | 370/366 |
| 2006/0132209 A1* | 6/2006 | Meltzer et al. | 327/202 |
| 2009/0009226 A1* | 1/2009 | Mellor et al. | 327/255 |
| 2009/0128199 A1* | 5/2009 | Abdelli | 327/144 |
| 2010/0097102 A1* | 4/2010 | Masaki | 327/43 |
| 2011/0169536 A1* | 7/2011 | Friddell | 327/156 |
| 2013/0163361 A1* | 6/2013 | Nomoto et al. | 365/203 |
| 2013/0222031 A1* | 8/2013 | Behrends et al. | 327/203 |

OTHER PUBLICATIONS

Badel ,et al. "A Generic Standard Cell Design Methodology for Differential Circuit Styles." IEEE Design, Automation and Test in Europe, 2008. Mar. 10-14 2008.

* cited by examiner

MCML RETENTION FLIP-FLOP/LATCH FOR LOW POWER APPLICATIONS

BACKGROUND

Utilization of metal-oxide semiconductor (MOS) current-mode logic (MCML) components for logic applications within integrated circuits (ICs) offers a high performance, low power, and high frequency alternative to complementary metal-oxide semiconductor (CMOS) components. Current consumption for CMOS logic relative to MCML logic within a state of the art semiconductor manufacturing node demonstrates higher current consumption in the gigahertz (GHz) range for CMOS logic devices, thus making MCML logic devices a preferred choice for IC applications in the GHz range.

DETAILED DESCRIPTION

Figure 1A:
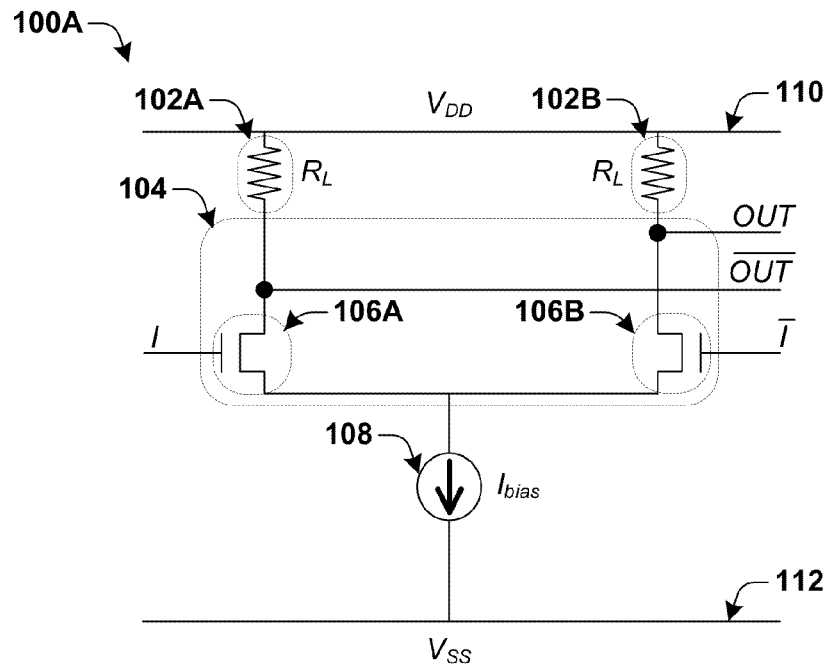
FIGS. 1A-1C illustrate basic functionality of MOS current-mode logic (MCML) buffers and inverters.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Moore's Law scaling of semiconductor integrated circuits (IC) components drives tradeoffs between device speed, power consumption, and die area for next generation microprocessors. A metal-oxide semiconductor (MOS) current mode logic (MCML) style demonstrates minimal power dissipation relative to a complementary metal-oxide semiconductor (CMOS) logic style for logic components (e.g., AND, NAND, XOR, XNOR, etc.), as well as master-slave flip-flops that form IC components for gigahertz (GHz) range applications of semiconductor based microprocessors. While the MCML logic style offers relief for power dissipation relative to the CMOS logic style, continued measures are required to further reduce dynamic/static power consumption of MCML logic devices.

Accordingly, the present disclosure relates to a device and method to reduce the dynamic/static power consumption of an MCML logic device. In order to retain register contents during power off mode, an MCML retention latch and flip-flop are disclosed. Retention latch circuits in an MCML architecture are used to retain critical register contents during power off mode, wherein combination logic including clock buffers on the clock tree paths are powered off to reduce dynamic/static power consumption. The MCML retention flip-flop comprises a master latch and a slave latch, wherein a power switch is added to the master latch to power the master latch off during power off mode. The slave latch includes pull-down circuits that remain active to enable the slave latch to retain data at a proper voltage level during power off mode. Other devices and methods are also disclosed.

FIG. 1A illustrates basic functionality of an MCML buffer 100A. The MCML buffer 100A comprises a first load resistor 102A further comprising a load resistance value $R_L$, and a second load resistor 102B further comprising the load resistance value $R_L$. The first load resistor 102A and the second load resistor 102B may further comprise a PMOS transistor, wherein the load resistance value $R_L$ may be adjusted by varying the dimensions of the PMOS. The MCML buffer 100A further comprises a differential pull-down network 104 with complementary input signals $\overline{I}$ and I (henceforth denoted as "I_bar" and similarly for other inverse complimentary signals), complementary output signals OUT and $\overline{OUT}$ (i.e., OUT_bar), and a constant current source 108 comprising a bias current value $I_{bias}$. The differential pull-down network 104 further comprises a first NMOS transistor 106A which receives the input signal I, and a second NMOS transistor 106B which receives the inverse input signal I_bar. The constant current source 108 provides a current path from a voltage source $V_{DD}$ 110 to ground $V_{SS}$ 112. For an input signal I that is high the first NMOS transistor 106A conducts from source to drain, allowing current flow from the voltage source $V_{DD}$ 110 to ground $V_{SS}$ 112. Consequently I_bar is low, resulting in an off state for the second NMOS transistor 106B. This pulls the output signal OUT to high and the inverse signal OUT_bar to low. The total power consumption of the MCML buffer 100A is equal to a product of the bias current value $I_{bias}$ and a value of the voltage source $V_{DD}$ 110:

$$\text{Power}=I_{bias} \times V_{DD}.$$

The current source 108 may comprise an NMOS transistor, wherein the bias current value $I_{bias}$ may be controlled by adjusting a gate voltage to the NMOS transistor, and setting the load resistance value $R_L$. The power dissipated in an MCML logic circuit varies linearly with the supply $V_{DD}$ and is essentially independent of the operating frequency, unlike conventional CMOS circuits where power dissipation depends linearly on operating frequency.

Figure 1B:
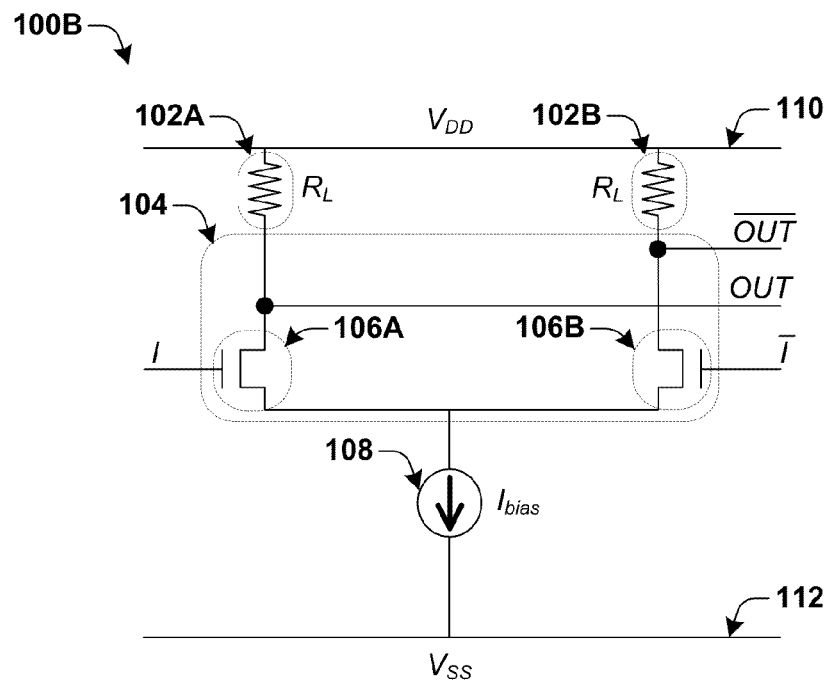

FIG. 1B illustrates basic functionality of an MCML inverter 100B. The configuration of the MCML inverter 100B is identical to that of the MCML buffer 100A, wherein the complementary output signals OUT and OUT_bar have been reversed. As a result, an input signal I that is high pulls the output signal OUT to low, and a resultant inverse input signal I_bar that is low pulls the inverse signal OUT_bar to high for the MCML inverter 100B.

Figure 1C:
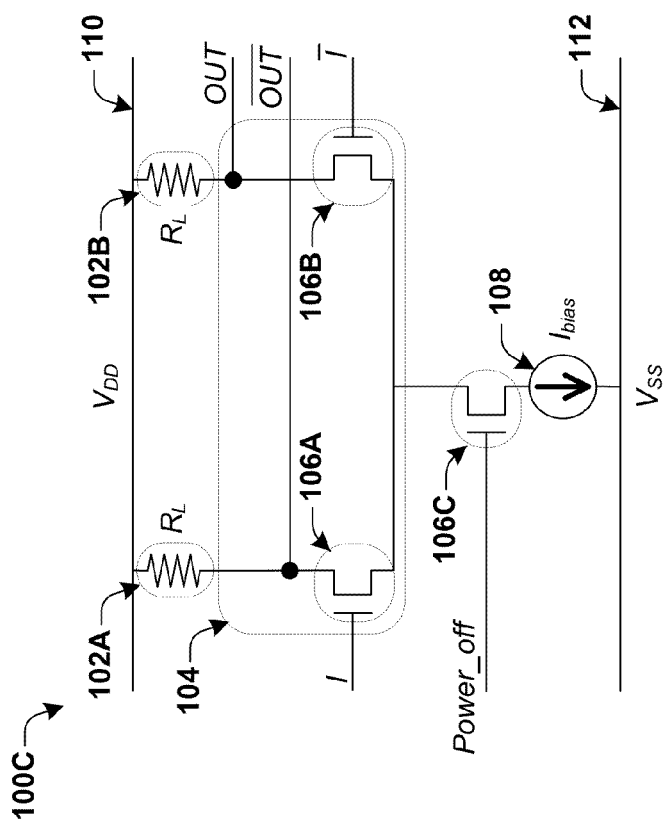

FIG. 1C illustrates basic functionality of an MCML buffer 100C, wherein MCML buffer 100A has been augmented with a third NMOS transistor 106C, configured to act as a power gate for MCML buffer 100C. A Power_off signal controls a gate of the third NMOS transistor 106C, wherein a Power_off value that is high allows current flow from the voltage source $V_{DD}$ 110 to ground $V_{SS}$ 112 such that MCML buffer 100C acts as MCML buffer 100A. A power off mode comprising a Power_off value that is low prevents current flow from the voltage source $V_{DD}$ 110 to ground $V_{SS}$ 112, such that the total power consumption of MCML buffer 100C is equal to approximately zero in the power off mode.

Figure 2:
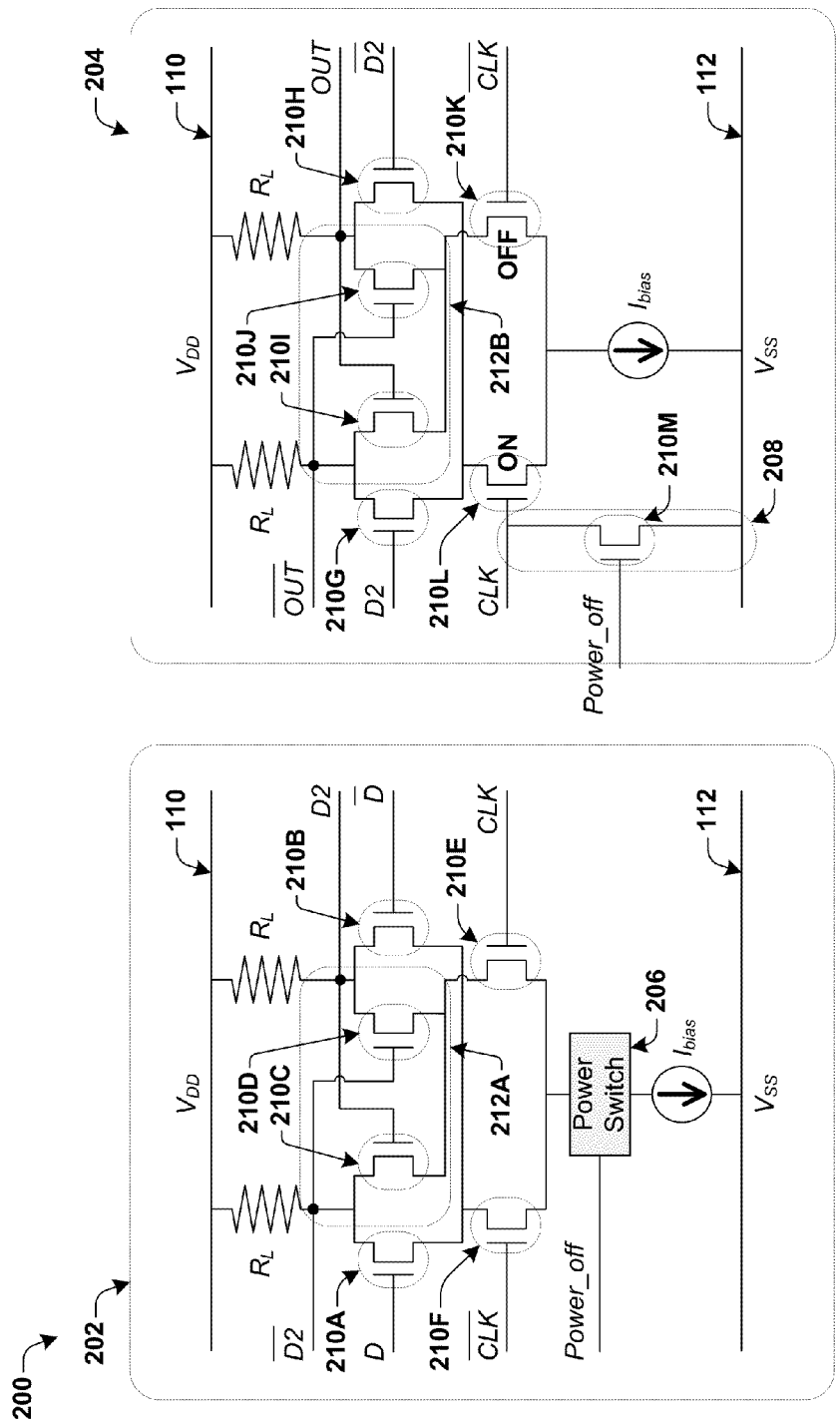
FIG. 2 illustrates some embodiments of an MCML retention flip-flop comprising a master latch further comprising a power switch and a slave latch further comprising pull-down circuitry.

FIG. 2 illustrates some embodiments of an MCML retention flip-flop 200 comprising a master latch 202 and a slave latch 204, wherein the master latch 202 and the slave latch 204 comprise dynamic latches (D latches), and are cascaded to form a edge triggered Master-Slave D flip-flop. The master latch 202 further comprises a first NMOS transistor 210A configured to receive a first input signal D and a second NMOS transistor 210B configured to receive an inverse first input signal D_bar. A third NMOS transistor 210C and a fourth NMOS transistor 210D comprise a first cross-coupled NMOS transistor structure 212A configured to retain data within the master latch 202, wherein the third NMOS transistor 210C outputs an inverse intermediate output signal D2_bar which serves as an inverse second input signal to the slave latch 204. The fourth NMOS transistor 210D outputs an intermediate output signal D2, which serves as a second input signal to the slave latch 204. The master latch 202 further comprises a low enable dynamic latch, wherein a falling clock edge of an inverse clock signal (CLK_bar) received by a sixth NMOS transistor 210F allows the first input signal D to be received by the master latch 202 and stored in the first cross-coupled NMOS transistor structure 212A until the next falling clock edge. A clock signal (CLK), is received by a fifth NMOS transistor 210E. Note that for the MCML retention flip-flop 200 the master latch 202 is isolated from the slave latch 204 for a given state of CLK and CLK_bar such that changes to one do not affect the other.

Analogously, the slave latch 204 further comprises a seventh NMOS transistor 210G configured to receive the intermediate output signal D2 and an eighth NMOS transistor 210H configured to receive the inverse intermediate output signal D2_bar. A ninth NMOS transistor 210I and a tenth NMOS transistor 210J comprise a second cross-coupled NMOS structure transistor 212B configured to retain data within the slave latch 204, wherein the ninth NMOS transistor 210I outputs an inverse output signal OUT_bar of the MCML retention flip-flop 200, and the tenth NMOS transistor 210J outputs an output signal OUT. The second cross-coupled NMOS structure transistor 212B is configured such that the output signal OUT controls an "on" and "off" state of the ninth NMOS transistor 210I. The "on" and "off" state of the seventh NMOS transistor 210G along with the state of the ninth NMOS transistor 210I dictate the inverse output signal OUT_bar.

The slave latch 204 further comprises a high enable dynamic latch, wherein a rising clock edge of the clock signal (CLK) received by a twelfth NMOS transistor 210L allows the intermediate output signal D2 to be received by the slave latch 204 and stored in the second cross-coupled NMOS transistor structure 212B until the next rising clock edge. Note that the CLK and CLK_bar inputs of the fifth NMOS transistor 210E and sixth NMOS transistor 210F are configured opposite those of an eleventh NMOS transistor 210K and the twelfth NMOS transistor 210L, which distinguishes the falling edge and rising edge behavior of the master latch 202 and the slave latch 204, respectively.

The master latch 202 further comprises a power switch 206 configured to disable current flow from a voltage source $V_{DD}$ 110 to ground $V_{SS}$ 112 to disable power consumption of the master latch 202 during a power off mode of MCML retention flip-flop 200, wherein the power switch 206 is controlled by a Power_off signal. The slave latch 204 further comprises pull-down circuitry 208 comprising a thirteenth NMOS transistor 210M configured to receive the Power_off signal, and wherein the power off mode comprising a Power_off value that is high diverts the CLK signal from the twelfth NMOS transistor 210L to ground $V_{SS}$ 112, and a Power_off value that is low allows the CLK signal to be received by the twelfth NMOS transistor 210L. The pull-down circuitry is further configured to enable the slave latch 204 to maintain stored data at a constant voltage level during power off mode. Therefore, the voltage level of D2 and D2_bar is irrelevant during power off mode. Note that while the pull-down circuitry 208 of the embodiments of FIG. 2 comprises a thirteenth NMOS transistor 210M, in general the pull-down circuitry 208 can be any circuits that pull the CLK input of slave latch 204 to a low level. Note further that many other flip-flop topologies for edge triggered flip-flops may be utilized in conjunction with the power switch 206 and the pull-down circuitry 208 to achieve power savings and data retention in the power off mode.

Figure 3:
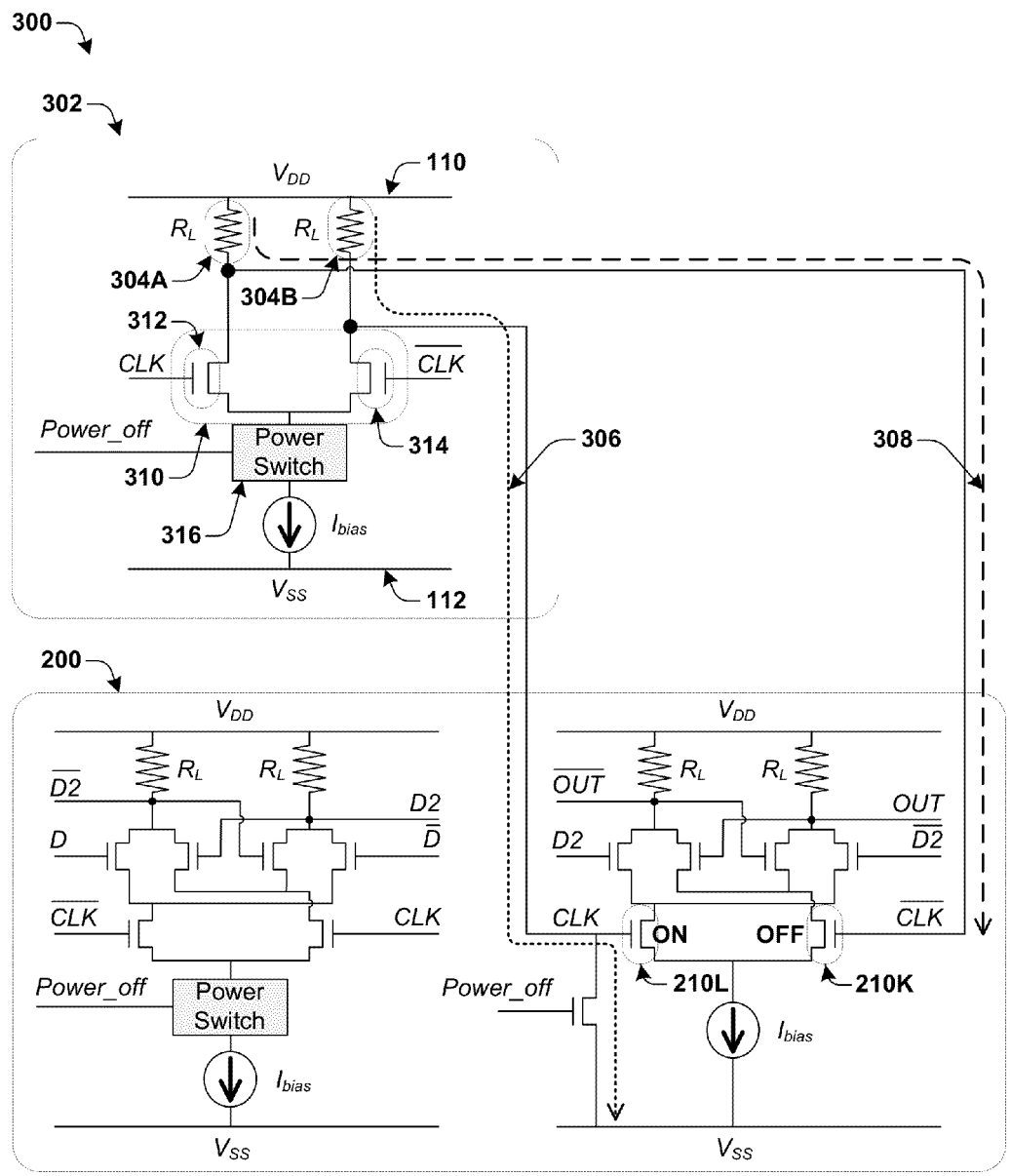
FIG. 3 illustrates some embodiments of a pull-up path and a pull-down path for the MCML retention flip-flop of FIG. 2 coupled to a differential input clock buffer.

FIG. 3 illustrates some embodiments of a pull-down path 306 and a pull-up path 308 for a buffered MCML retention flip-flop 300 comprising the MCML retention flip-flop 200 of FIG. 2 coupled to a differential input clock buffer 302. The pull-down path 306 is established from a voltage source $V_{DD}$ 110 through a second load resistor 304B to the twelfth NMOS transistor 210L of the MCML retention flip-flop 200. Current flow from $V_{DD}$ 110 is controlled by the second load resistor 304B and the thirteenth NMOS transistor 210M. During power down mode, a power switch 316 acts as a power gate for a differential pull-down network 310 comprising a first buffer NMOS transistor 312 and a second buffer NMOS transistor 314, resulting in an "off" state for the first buffer NMOS transistor 312 and the second buffer NMOS transistor 314, wherein a gate current is approximately zero and no current flows from drain to source. For the pull-up path 308, the voltage drop of a resistor 304A is approximately zero, because approximately no current passes through the resistor 304A. As a result, the voltage level of CLK_bar will be approximately $V_{DD}$. Similarly, the pull-up path 308 is established from the voltage source $V_{DD}$ 110 through a first load resistor 304A to the eleventh NMOS transistor 210K of the MCML retention flip-flop 200.

Figure 4:
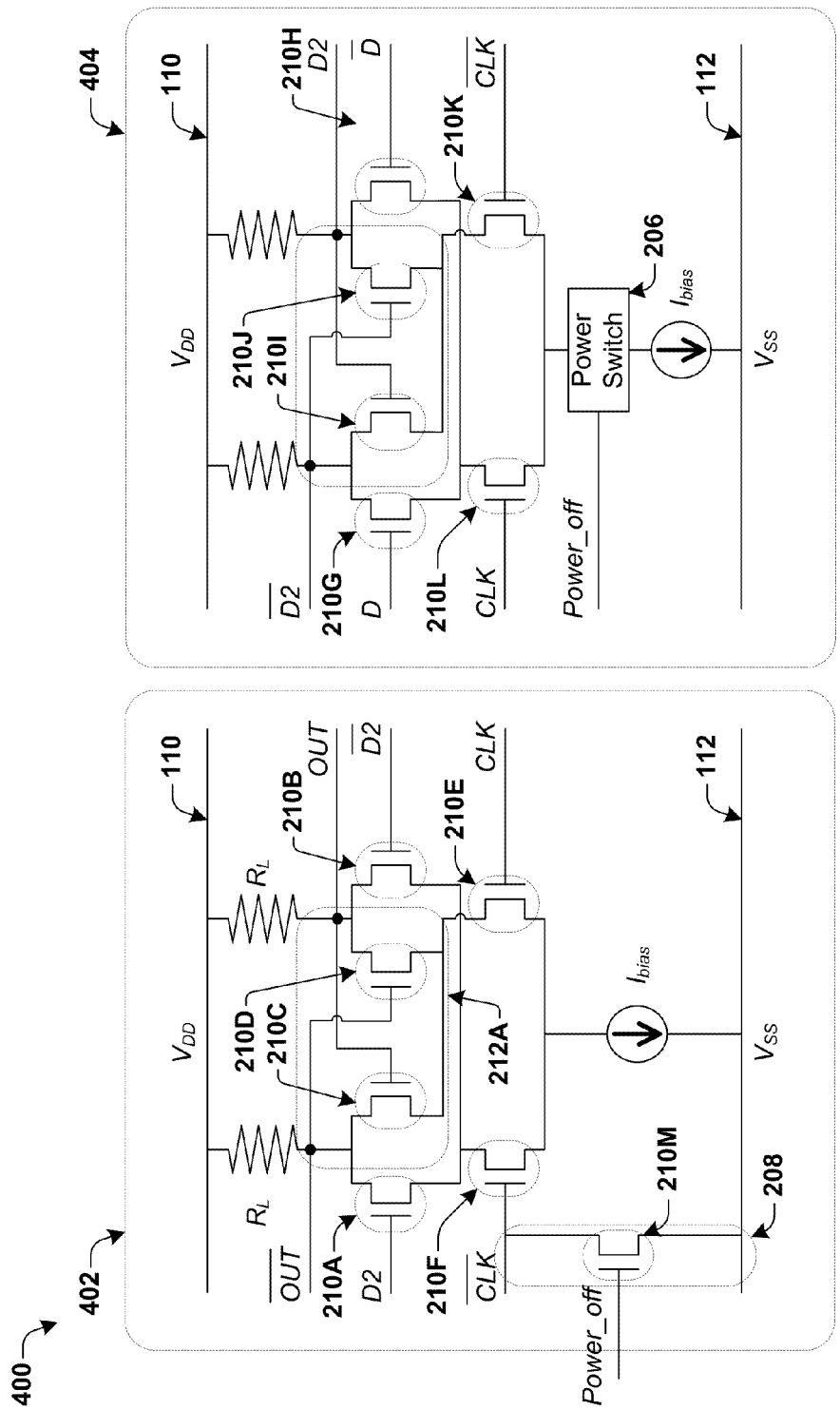
FIG. 4 illustrates some embodiments of an MCML retention flip-flop comprising a master stage further comprising pull-down circuitry and a slave stage further comprising a power switch.

FIG. 4 illustrates some embodiments of an MCML retention flip-flop 400 comprising a master latch 402 and a slave latch 404. The MCML retention flip-flop 400 is identical to the MCML retention flip-flop 200 of FIG. 2 with an exception that the positions of the power switch 206 and the pull-down circuitry 208 are reversed relative to FIG. 2. The master latch 402 comprises the pull-down circuitry 208 configured to receive a Power_off signal to divert the CLK_bar signal to ground $V_{SS}$ 112, and enables the master latch 402 to maintain stored data at a constant voltage level during power off mode. The slave latch 404 comprises the power switch 206 configured to disable current flow from a voltage source $V_{DD}$ 110 to ground $V_{SS}$ 112 to disable power consumption of the slave latch 404 during a power off mode of MCML retention flip-flop 400, wherein the power switch 206 is controlled the Power_off signal.

Figure 5:
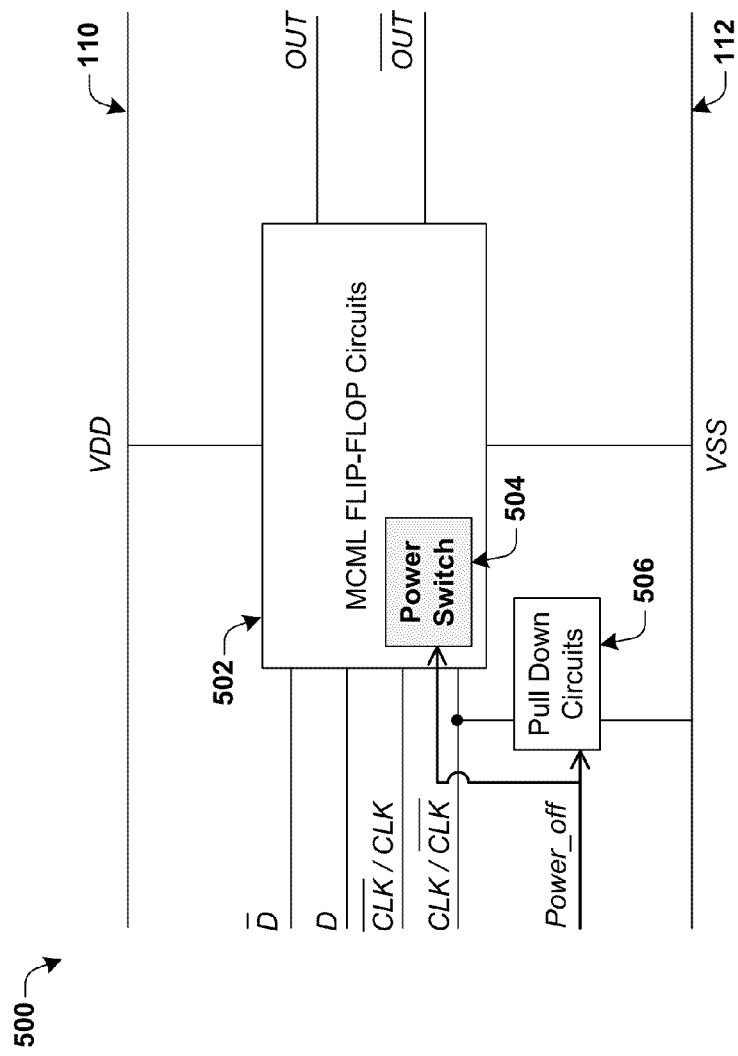
FIG. 5 illustrates some embodiments of a general form of a retention flip-flop configured to retain register components.

FIG. 5 illustrates some embodiments of a general form of a retention flip-flop 500 configured to retain register components, comprising MCML flip-flop circuits 502 which may further comprise any flip-flop architectures, a power switch 504 coupled to a master latch or a slave latch of the MCML flip-flop circuits 502, respectively, and configured to disable current flow from a constant current source to disable power consumption of the master latch or the slave latch, respectively, and pull-down circuitry 506 coupled to the slave latch or the master latch, respectively, and configured to receive a Power_off signal to direct the pull-down circuitry 506 to divert the clock signal CLK from the slave latch or the master latch, respectively, wherein the register contents remain stored, to ground $V_{SS}$ 112 during power off mode. The pull-down circuitry 506 is further configured to enable the slave latch or master latch to maintain stored data at a constant voltage level during power off mode. In some embodiments, the retention flip-flop 500 further comprises a master latch configured to receive differential input data signals D and D_bar as well as a clock signal CLK and inverse clock signal CKL_bar, and transmit differential intermediate output data to the slave latch, wherein the slave latch is configured to transmit differential output data OUT and OUT_bar from the retention flip-flop 500.

Figure 6:
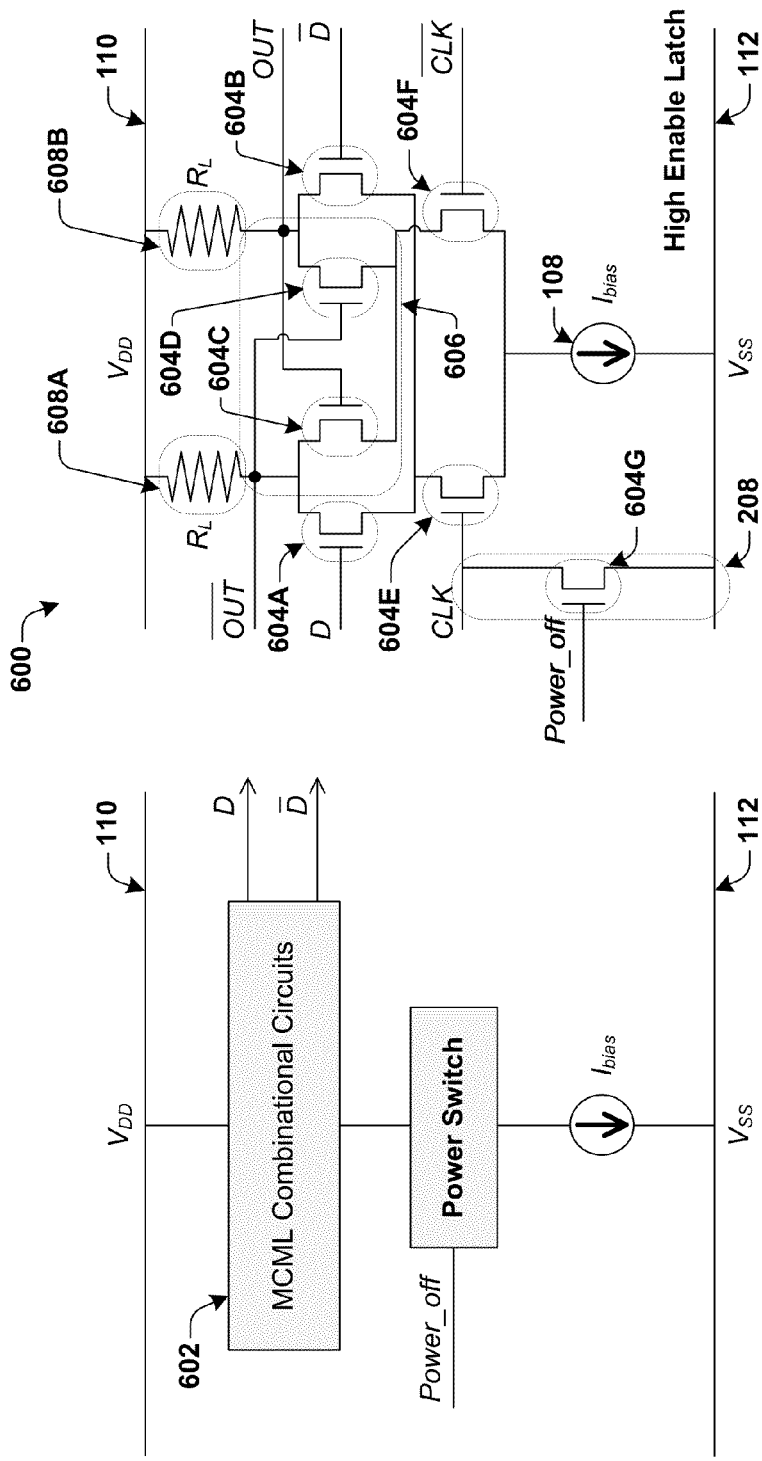
FIG. 6 illustrates some embodiments of a high-enable retention latch circuit in an MCML architecture configured to retain register components during power off mode.

FIG. 6 illustrates some embodiments of a high-enable retention latch circuit 600 in an MCML architecture 602 configured to retain register components during power off mode. During a power off mode, all combination logic of the MCML architecture 602, including clock buffers on clock tree paths within the MCML architecture 602 are powered off to reduce dynamic/static power consumption. The high-enable retention latch circuit 600 is similar to the slave latch 204 of FIG. 2. The high-enable retention latch circuit 600 comprises a first gate of a first NMOS transistor 604A configured to receive an output signal D of an MCML architecture 602, and a second gate of a second NMOS transistor 604B configured to receive an inverse output signal D_bar of the MCML architecture 602. The output signal D and inverse output signal D_bar are stored in a cross-coupled NMOS structure 606 comprising a third NMOS transistor 604C and a fourth NMOS transistor 604D. The high-enable retention latch circuit 600 is configured such that a first source of the first NMOS transistor 604A and a second source of the second NMOS transistor 604B are coupled to each other, an inverse output signal OUT_bar of the high-enable retention latch circuit 600, a first load resistor 608A which is also coupled to a voltage source $V_{DD}$ 110, and a fourth gate of the fourth NMOS transistor 604D. The first source of the first NMOS transistor 604A is coupled to a fifth drain of a fifth NMOS transistor 604E as well as a second source of the second NMOS transistor 604B. The high-enable retention latch circuit 600 is further configured such that a second drain of the second NMOS transistor 604B and a fourth drain of the fourth NMOS transistor 604D are coupled to each other, an output signal OUT of the high-enable retention latch circuit 600, a second load resistor 608B which is also coupled to the voltage source $V_{DD}$ 110, and a third gate of the third NMOS transistor 604C. A third source of the third NMOS transistor 604C and a fourth source of the fourth NMOS transistor 604D comprising the cross-coupled NMOS structure 606 are coupled to each other and to a sixth drain of a sixth NMOS transistor 604F. A fifth gate of the fifth NMOS transistor 604E is configured to receive a clock signal CLK, and sixth gate of the sixth NMOS transistor 604F is configured to receive an inverse clock signal CLK_bar. A fifth source of the fifth NMOS transistor 604E and a sixth source of the sixth NMOS transistor 604F are coupled to each other and a current source 108 comprising a bias current value $I_{bias}$, which is also coupled to ground $V_{SS}$ 112.

The high-enable retention latch circuit 600 further comprises pull-down circuitry 208 comprising a seventh NMOS transistor 604G configured to receive a Power_off signal, and wherein the power off mode comprising a Power_off value that is high diverts the CLK signal from the seventh NMOS transistor 604G to ground $V_{SS}$ 112, and a Power_off value that is low allows the CLK signal to be received by the fifth NMOS transistor 604E. Note that while the pull-down circuitry 208 of the embodiments of FIG. 2 comprises a seventh NMOS transistor 604G, in general the pull-down circuitry 208 can be any circuits that pull the CLK input of high-enable retention latch circuit 600 to a low level.

Figure 7:
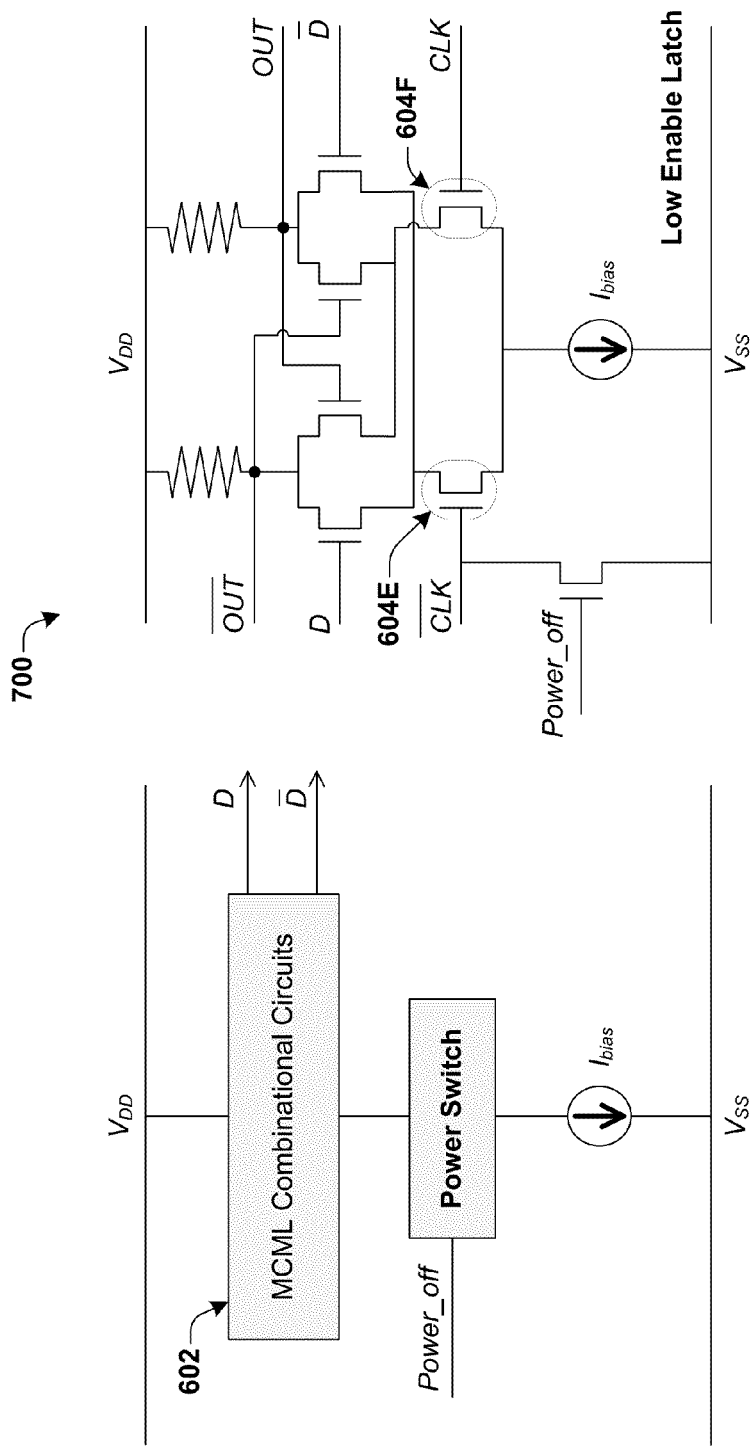
FIG. 7 illustrates some embodiments of a low-enable retention latch circuit in an MCML architecture configured to retain register components during power off mode.

FIG. 7 illustrates some embodiments of a low-enable retention latch circuit 700 in the MCML architecture 602 configured to retain register components during power off mode. The only substantial difference between low-enable retention latch circuit 700 and high-enable retention latch circuit 600 of FIG. 6 is that the CLK and CLK_bar inputs of the fifth NMOS transistor 604E and sixth NMOS transistor 604F of low-enable retention latch circuit 700 are configured opposite those of high-enable retention latch circuit 600. The high-enable retention latch circuit 600 responds to a rising edge of the CLK signal to output data, whereas the low-enable retention latch circuit 700 responds to a falling edge of the CLK signal to output data.

Figure 8:
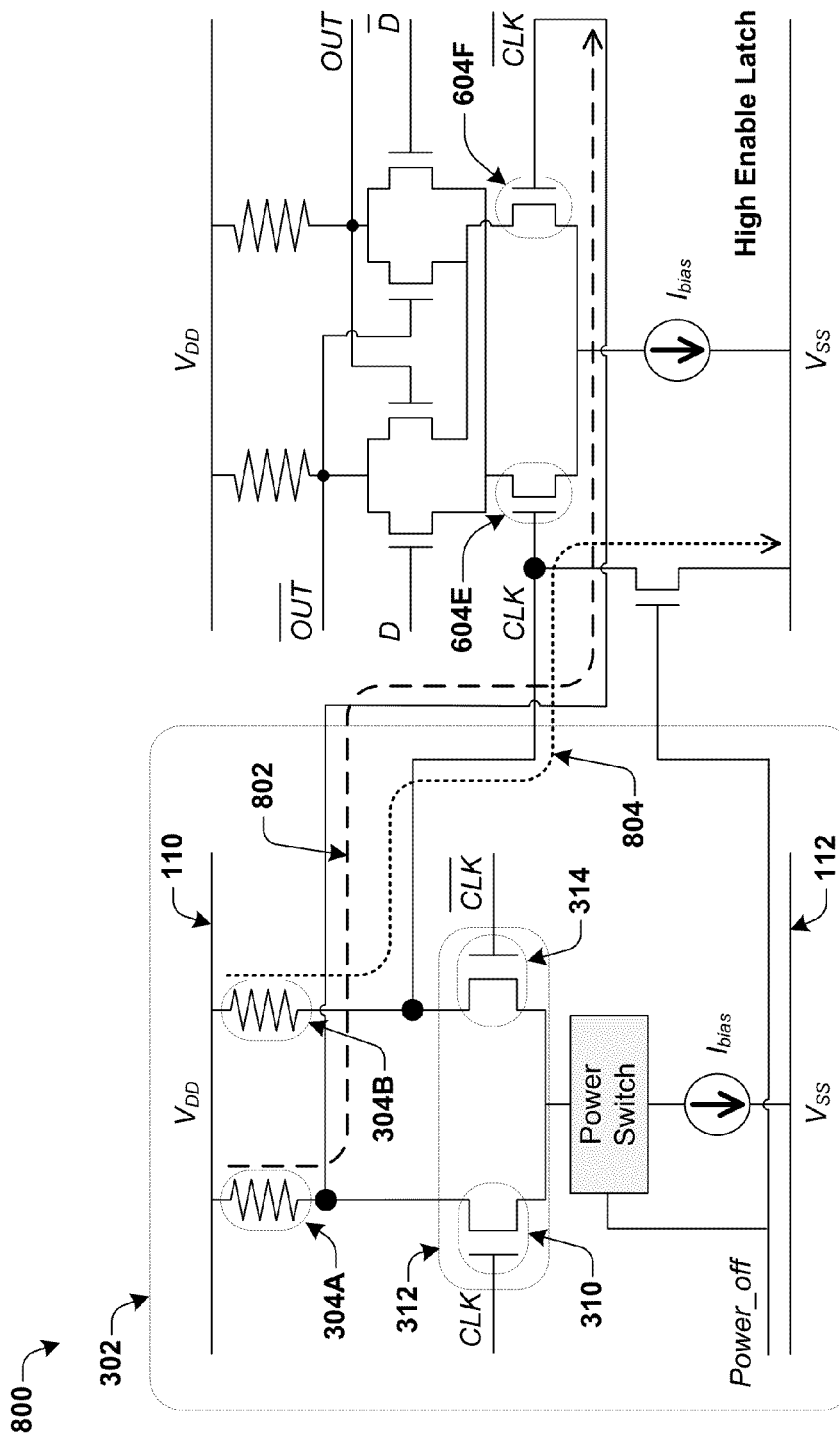
FIG. 8 illustrates some embodiments of a retention latch application comprising a pull-up path and a pull-down path for the high-enable retention latch circuit of FIG. 6 coupled to a clock buffer.

FIG. 8 illustrates some embodiments of a retention latch application 800 comprising a pull-up path 802 and a pull-down path 804 for the high-enable retention latch circuit 600 of FIG. 6 coupled to the differential input clock buffer 302 of FIG. 3. The pull-up path 802 is established from a voltage source $V_{DD}$ 110 through the first load resistor 304A to the sixth NMOS transistor 604F of the high-enable retention latch circuit 600. The pull-down path 804 is established from the voltage source $V_{DD}$ 110 through the second load resistor 304B to the fifth NMOS transistor 604E of the high-enable retention latch circuit 600. Note that a voltage level of differential inputs to the high-enable retention latch circuit 600 is irrelevant when the retention latch application 800 is in a power off mode.

Figure 9:
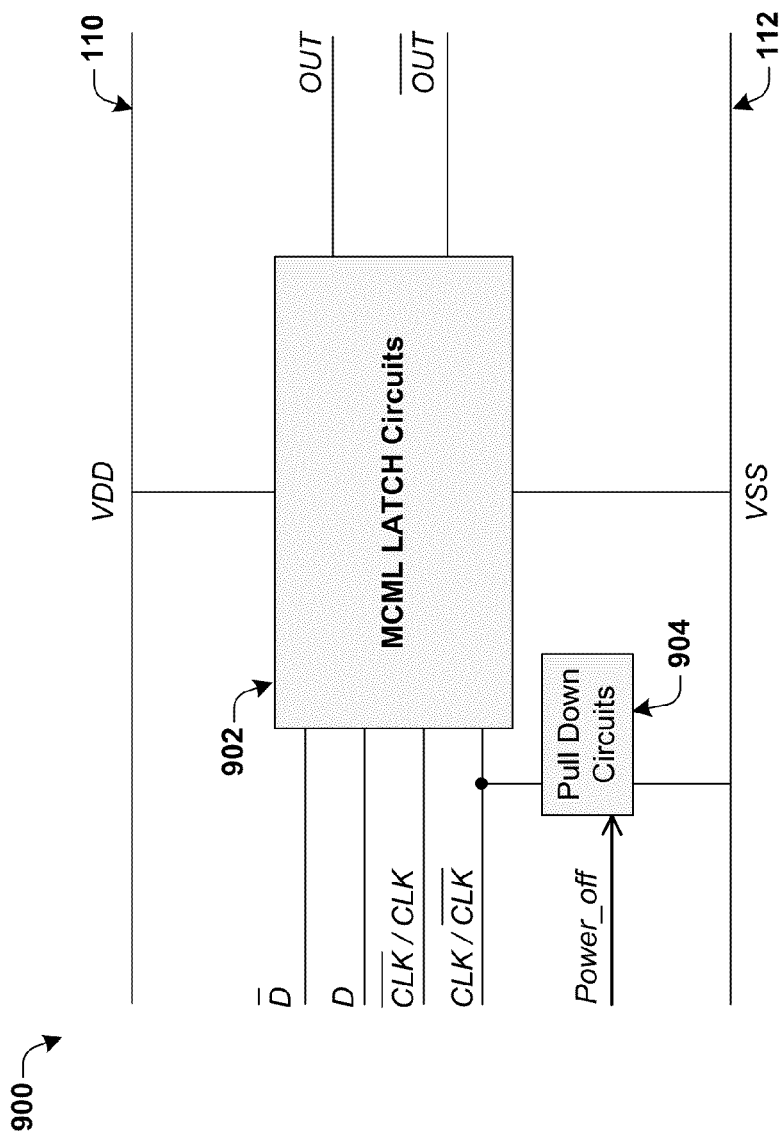
FIG. 9 illustrates some embodiments of a general form of a retention latch configured to retain register components.

FIG. 9 illustrates some embodiments of a general form of a retention latch 900 configured to retain register components, comprising MCML latch circuits 902 which may comprise any latch architecture and pull-down circuitry 904 coupled to a clock signal CLK or CLK_bar of the retention latch 900, and configured to receive a Power_off signal to direct the pull-down circuitry 904 to divert the clock signal CLK or CLK_bar from the retention latch 900 to ground $V_{SS}$ 112 during power off mode. The pull-down circuitry 904 is further configured to enable the retention latch to maintain stored data at a constant voltage level during power off mode.

Figure 10A:
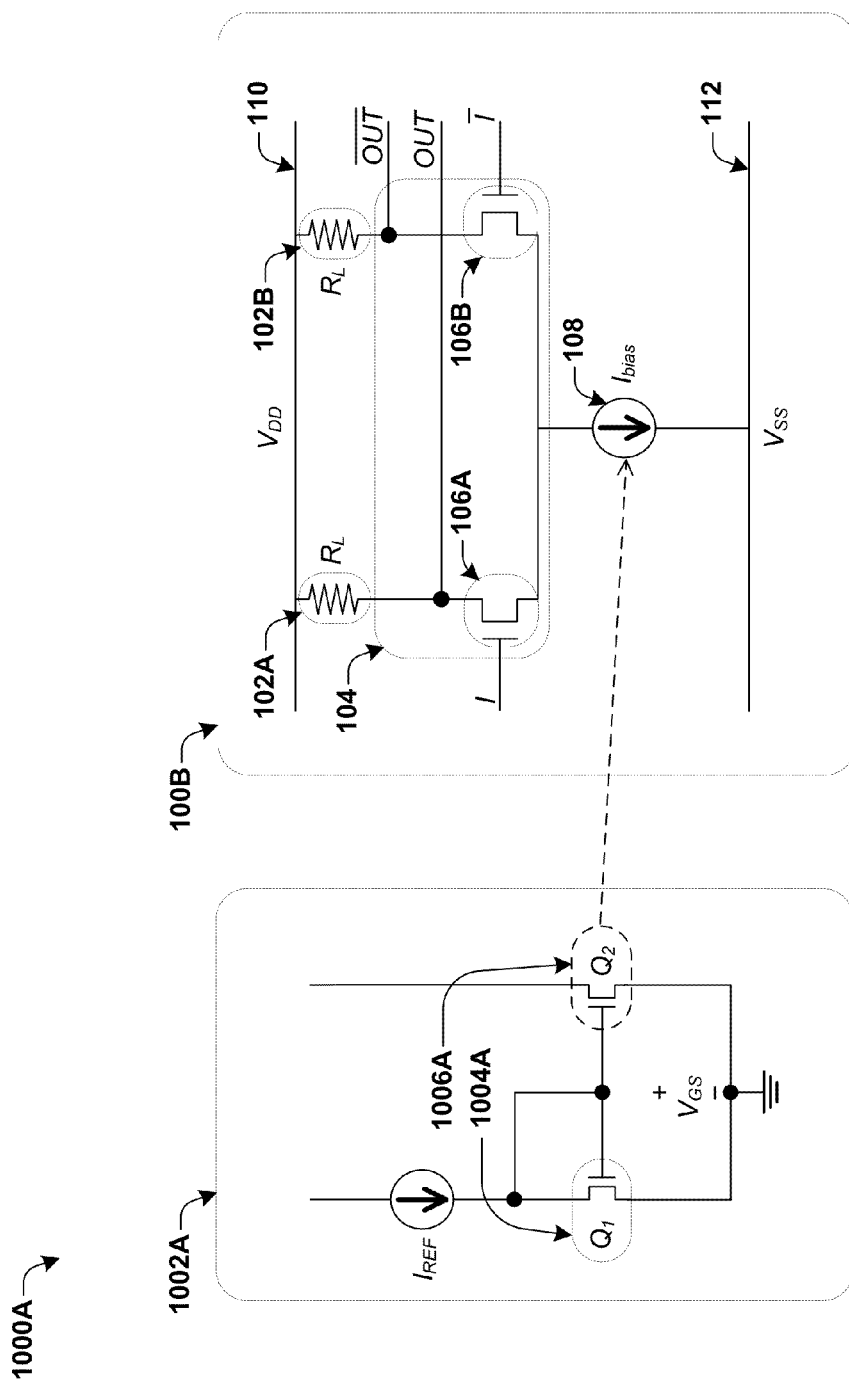
FIGS. 10A-10C illustrate some embodiments of a current mirror coupled to a power gated architecture comprising one or more power switches configured to disable power consumption in a power off mode.

FIG. 10A illustrates some embodiments of a current mirror 1002A configured to act as the current source (108) of the MCML inverter 100B of FIG. 1B. The current mirror 1002A comprises a current-to-current converter further comprising two cascaded transistors: a first transistor ($Q_1$) 1004A is connected to ground, and a second transistor ($Q_2$) 1006A configured to generate the bias current value $I_{bias}$. $Q_1$1004A and $Q_2$1006A further comprise substantially similar device properties (e.g., dimensions, materials, dopants, etc.) such that current the bias current value $I_{bias}$ of $Q_2$1006A is approximately equal to a reference current value $I_{REF}$ of $Q_1$ 1004A.

Figure 10B:
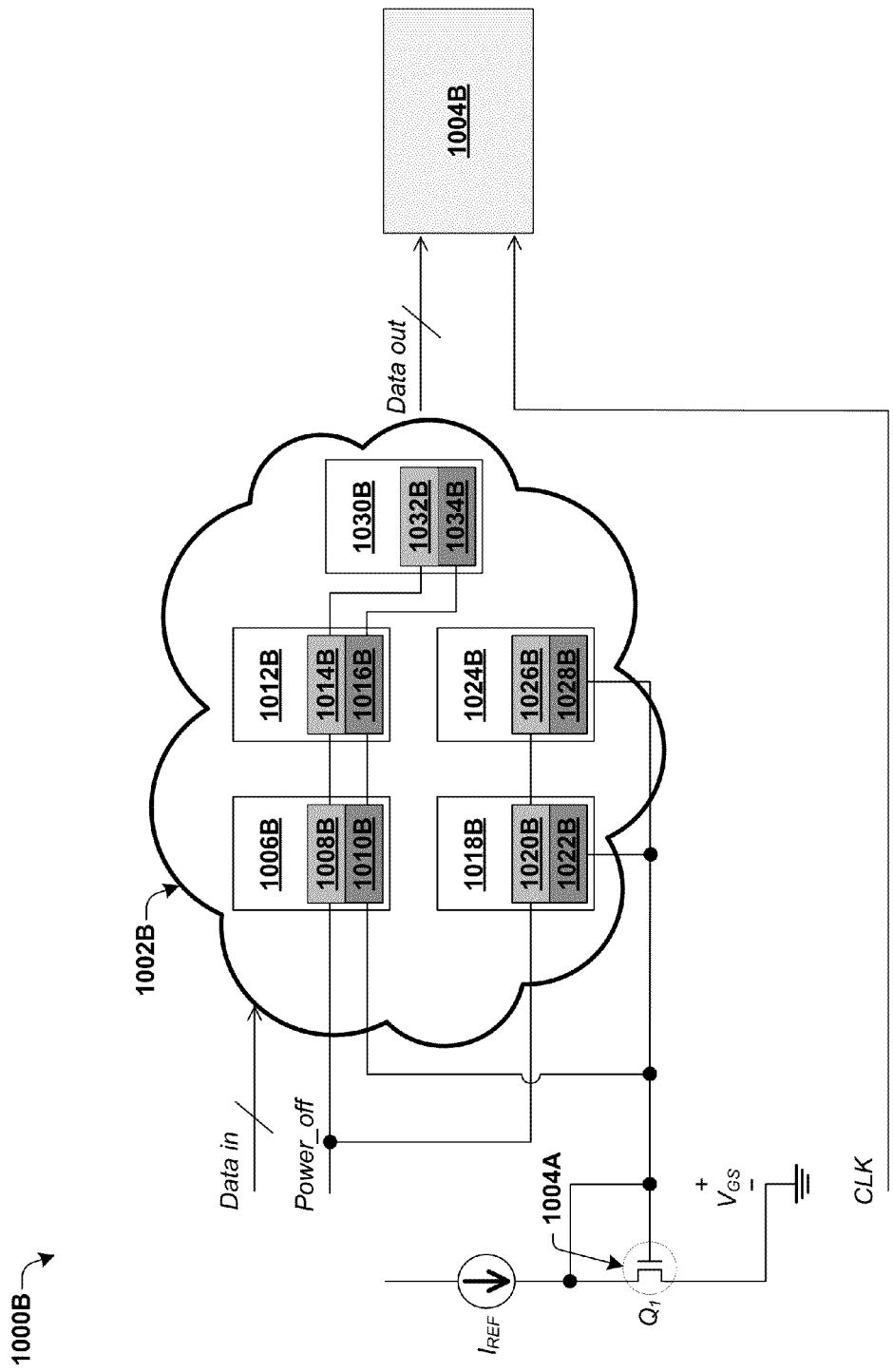

FIG. 10B illustrates some embodiments of a power gated architecture 1000B comprising the first transistor ($Q_1$) 1004A of FIG. 10A configured as one half of a current mirror structure to generate the bias current value $I_{bias}$, a logic block 1002B configured to receive input data (Data in) and to generate output data (Data out) which is sent to a retention flip-flop 1004B. The retention flip-flop 1004B comprises a master latch and a slave latch, wherein a power switch is added to the master latch or slave latch to power off the master latch or slave latch during a power off mode, in accordance with the previous embodiments. The logic block 1002B further comprises: an AND device 1006B further comprising a first power switch 1008B configured to enable or disable a first current source 1010B, an OR device 1012B further comprising a second power switch 1014B configured to enable or disable a second current source 1016B, an inverter (INV) 1018B further comprising a third power switch 1020B configured to enable or disable a third current source 1022B, a buffer (BUF) 1024B further comprising a fourth power switch 1026B configured to enable or disable a fourth current source 1028B, and a multiplexer (MUX) 1030B further comprising a fifth power switch 1032B configured to enable or disable a fifth current source 1034B.

The first current source 1010B, second current source 1016B, third current source 1022B, fourth current source 1028B, and fifth current source 1034B each comprise a transistor further comprising substantially similar device properties to $Q_1$ 1004A. The first power switch 1008B, second power switch 1014B, third power switch 1020B, fourth power switch 1026B, and fifth power switch 1032B are each configured to enable or disable a respective current source responsive to a Power_off signal to disable power consumption to a respective device during power off mode. In some embodiments the respective device, comprising the AND device 1006B, OR device 1012B, INV 1018B, BUF 1024B, and MUX 1030B each comprise a plurality of logic gates (e.g., transistors), wherein a respective power switch is coupled to each gate. Moreover, in some embodiments the logic block 1002B may comprise a subset of the aforementioned devices, or additional devices may be included in a manner of the embodiments of logic block 1002B.

Figure 10C:
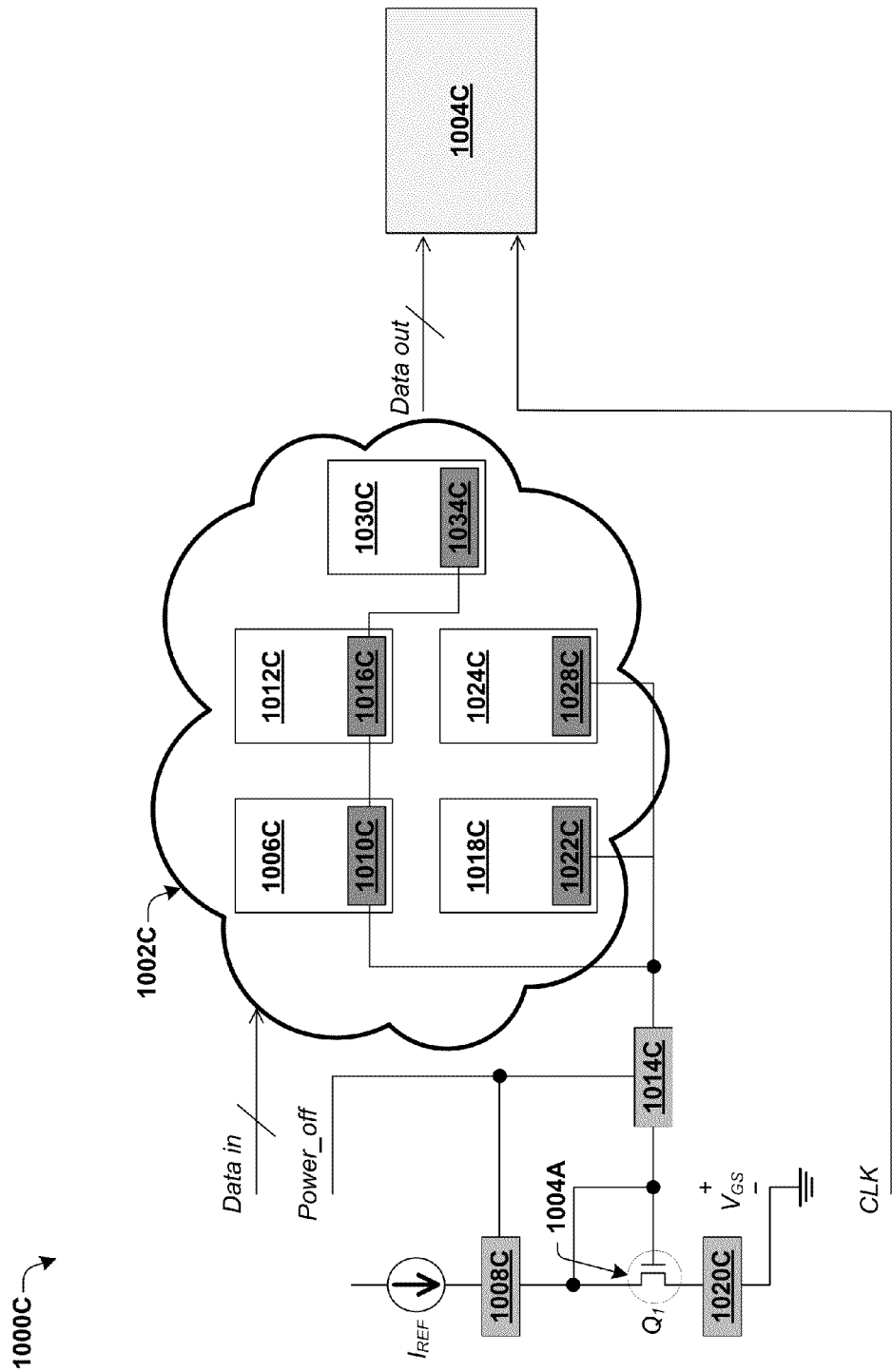

FIG. 10C illustrates some embodiments of a power gated architecture 1000C comprising $Q_1$ 1004A configured as one half of a current mirror structure to generate the bias current value $I_{bias}$, a logic block 1002C configured to receive input data (Data in) and to generate output data (Data out) which is sent to a retention flip-flop 1004C. The retention flip-flop 1004C is configured to retain the output data in a power off mode in accordance with the previous embodiments. The logic block 1002C further comprises: an AND device 1006C coupled to a first current source 1010C configured as a first current mirror of $Q_1$ 1004A, an OR device 1012C coupled to a second current source 1016C configured as a second current mirror of $Q_1$ 1004A, an INV 1018C further coupled to a third current source 1022C configured as a third current mirror of $Q_1$ 1004A, a BUF 1024C coupled to a fourth current source 1028C configured as a fourth current mirror of $Q_1$ 1004A, and a MUX 1030C coupled to a fifth current source 1034C configured as a fifth current mirror of $Q_1$ 1004A.

For some embodiments of FIG. 10B, wherein a respective device comprising the AND device 1006B, OR device 1012B, INV 1018B, BUF 1024B, and MUX 1030B each comprise a plurality of logic gates, a power switch must be coupled to each gate to disable power to each gate in power off mode. In contrast, the embodiments of power gated architecture 1000C comprise a single power switch coupled to the current mirror structure and configured disable source current to each respective device comprising the AND device 1006B, OR device 1012B, INV 1018B, BUF 1024B, and MUX 1030B. For some embodiments comprising power gated architecture 1000C with a single power switch, a first power switch 1008C is added between $Q_1$ 1004A and a reference current $I_{REF}$ from which a bias current is derived for each device, thus disabling $I_{REF}$ responsive to a Power_off and consequently setting a respective bias current to zero to disable power consumption to the respective device during power off mode. For some embodiments comprising power gated architecture 1000C with a single power switch, a second power switch 1014C is added to disable to an output of the current mirror structure which sets the bias current to zero during power off mode. For some embodiments comprising power gated architecture 1000C with a single power switch, a third power switch 1020C is added between $Q_1$ 1004A and ground to divert $I_{REF}$ to ground which sets the bias current to zero during power off mode. Any one of the three power switch configurations comprising the first power switch 1008C, the second power switch 1014C, or the third power switch 1020C may be utilized individually to achieve an equivalent power gating result without the need to add a power switch to each logic gate.

Figure 11A:
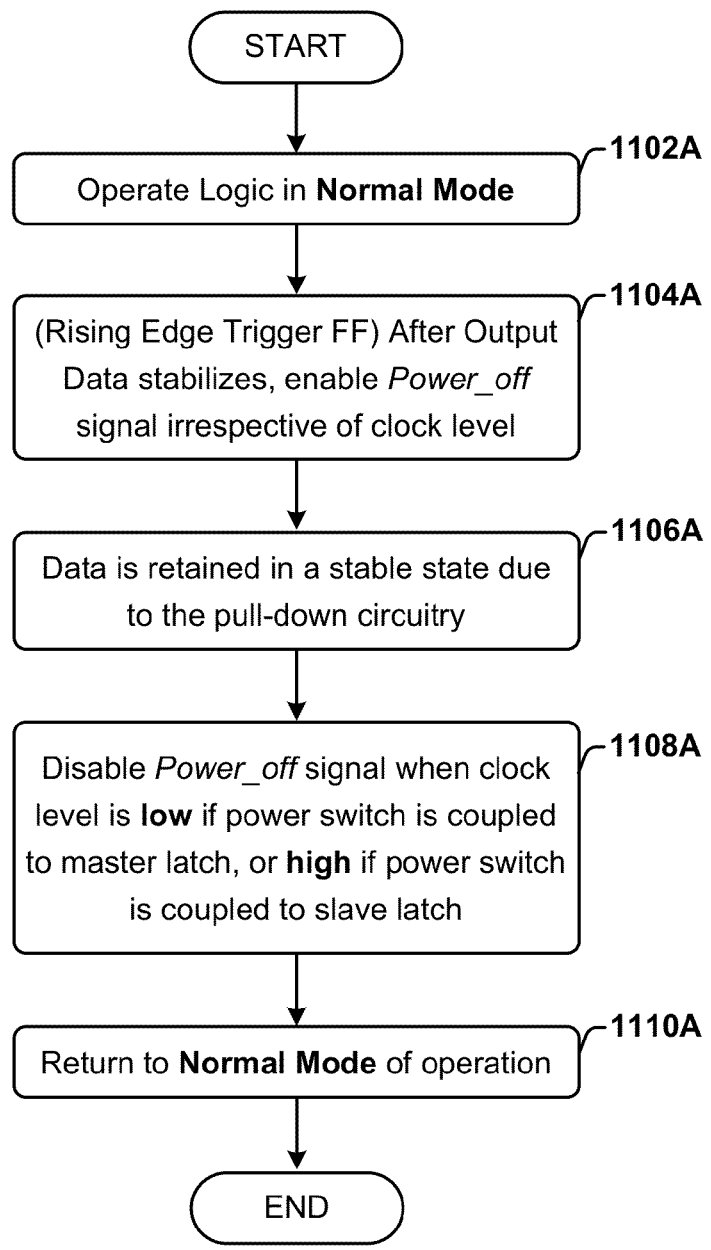
FIGS. 11A-11B illustrate some embodiments of a method to power on and power off an MCML retention flip-flop.
Figure 11B:
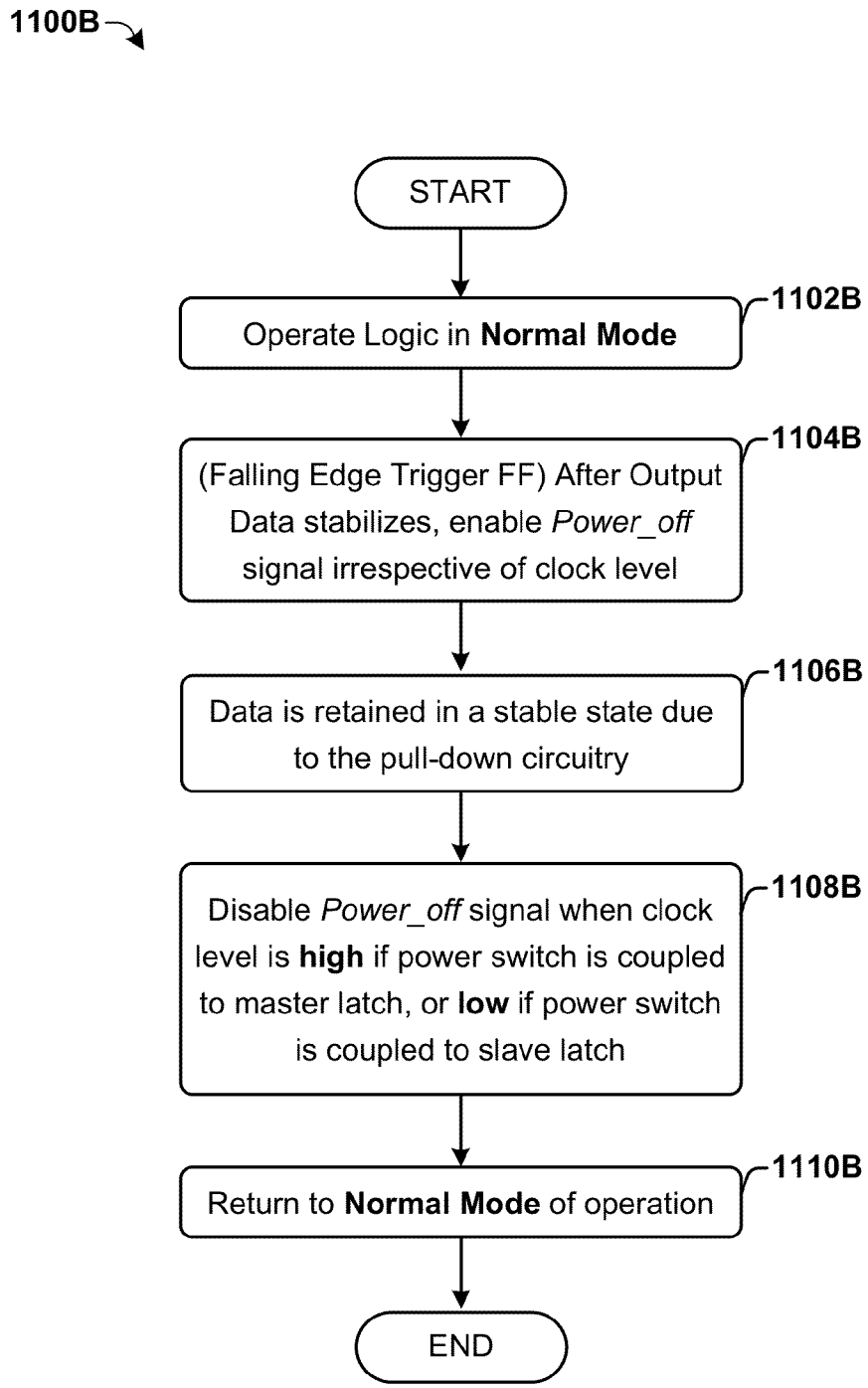

FIGS. 11A-11B illustrate some embodiments of methods 1100A and 1100B, respectively, to power on and power off an MCML retention flip-flop. While methods 1100A and 1100B are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 11A illustrates some embodiments of a method 1100A to power on and power off a rising edge MCML retention flip-flop.

At 1102A chip logic and registers operate in normal mode, registers comprising one or more input registers and one or more output registers, a respective output register further comprising a rising edge retention flip-flop, wherein the one or more input registers deliver input data to a chip logic segment responsive to a clock signal, chip logic operates on the input data, and the chip logic segment sends output data to the one or more output registers.

At 1104A after the output data stabilizes, a Power_off signal is enabled irrespective of a clock level to turn off a power switch coupled to a master latch or a slave latch, respectively, of the rising edge retention flip-flop, wherein the power switch is configured to disable current flow from a constant current source to disable power consumption of the master latch or the slave latch, respectively. The Power_off signal further directs pull-down circuitry coupled to the slave latch or the master latch, respectively, wherein the output data resides, to divert the clock signal from the slave latch or the master latch, respectively, to ground during power off mode.

At 1106A the slave latch or the master latch, respectively, will retain the output data. In some embodiments, the output data that is retained by the one or more output registers comprises finite state machine (FSM) states of a FSM device.

At 1108A for output registers comprising the rising edge retention flip-flop, the Power_off signal is disabled when the clock level is low if the power switch is coupled to the master latch and the power down circuit is coupled to slave latch, or high if the power switch is coupled to slave latch and the power down circuit is coupled to master latch, to avoid data collisions between master and slave latches of the rising edge retention flip-flop.

At 1110A the chip logic and registers return to normal mode of operation.

FIG. 11B illustrates some embodiments of a method 1100B to power on and power off a falling edge MCML retention flip-flop.

At 1102B chip logic and registers operate in normal mode, registers comprising one or more input registers and one or more output registers, a respective output register further comprising a falling edge retention flip-flop.

At 1104B after the output data stabilizes, a Power_off signal is enabled irrespective of a clock level to turn off a power switch coupled to a master latch or a slave latch, respectively, of the falling edge retention flip-flop, wherein the power switch is configured to disable current flow from a constant current source to disable power consumption of the master latch or the slave latch, respectively. The Power_off signal further directs pull-down circuitry coupled to the slave latch or the master latch, respectively, wherein the output data resides to divert the clock signal from the slave latch or the master latch, respectively, to ground during power off mode.

At 1106B the slave latch or the master latch, respectively, will retain the output data.

At 1108B for output registers comprising the falling edge retention flip-flop, the Power_off signal is disabled when the clock level is high if the power switch is coupled to the master latch and the power down circuit is coupled to slave latch, or low if the power switch is coupled to the slave latch and the power down circuit is coupled to the master latch, to avoid data collisions between master and slave latches of the falling edge retention flip-flop.

At 1110B the chip logic and registers return to normal mode of operation.

Figure 12A:
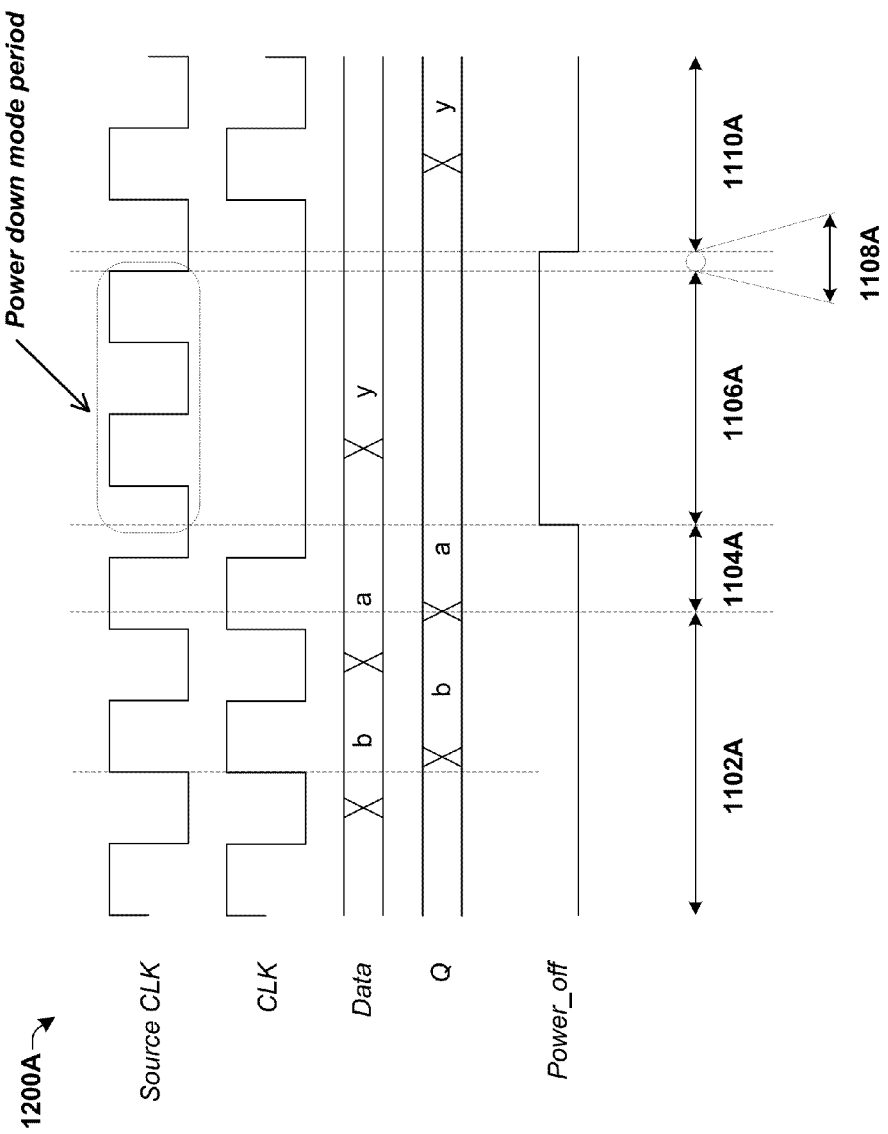
FIGS. 12A-12D illustrate timing diagrams of some embodiments of MCML retention flip-flops.

FIG. 12A illustrates a timing diagram 1200A of some embodiments of a rising edge MCML retention flip-flop comprising a high-enable slave latch comprising a power switch coupled to a master latch and a power down circuit coupled to the high-enable slave latch, wherein a power off mode comprising enabling of a Power_off signal is performed in accordance with the method 1100A. Enabling of the Power_off signal (1104A) occurs while a centralized source clock (Source CLK) signal controlling chip logic and registers comprising the rising edge MCML retention flip-flop is low, diverting the Source CLK signal to ground, and resulting in a local CLK signal to the rising edge MCML retention flip-flop that remains low for a duration wherein the Power_off signal remains enabled (1106A). Note that the voltage level of the Source CLK signal is irrelevant in power off mode as the local CLK signal level will remain constant irrespective of the Source CLK signal during a power off period. The Power_off signal is disabled while the Source CLK signal is low (1108A) to avoid data collisions between a master latch and a slave latch of the rising edge MCML retention flip-flop.

Figure 12B:
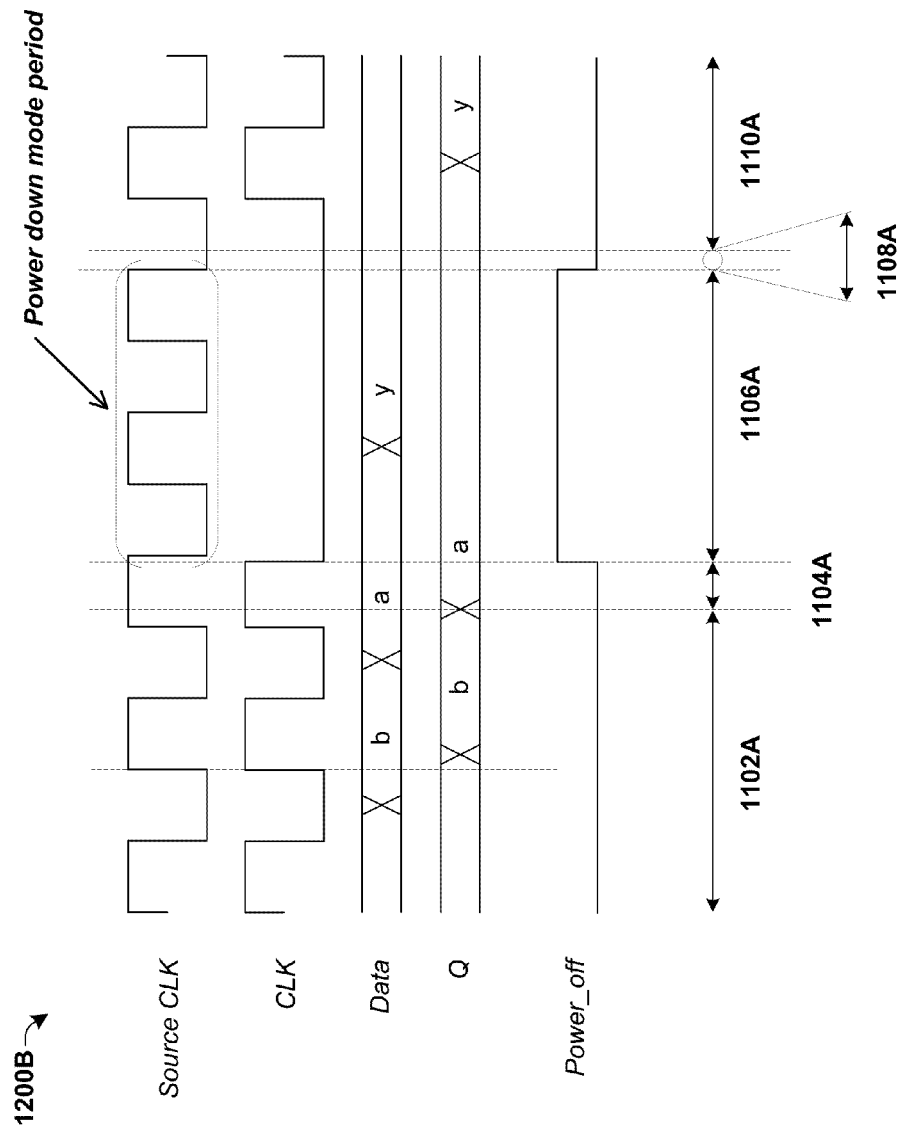

FIG. 12B illustrates a timing diagram 1200B of some embodiments of a rising edge MCML retention flip-flop comprising a high-enable slave latch comprising a power switch coupled to a master latch and a power down circuit coupled to the high-enable slave latch, wherein the Power_off signal is enabled in accordance with the method 1100A. Enabling of the Power_off signal (1104A) occurs while the Source CLK signal is high, diverting the Source CLK signal to ground, and resulting in a local CLK signal to the rising edge MCML retention flip-flop that becomes low for a duration wherein the Power_off signal remains enabled (1106A). The Power_off signal is disabled while the Source CLK signal is low (1108A) to avoid data collisions between the master latch and the slave latch.

Figure 12C:
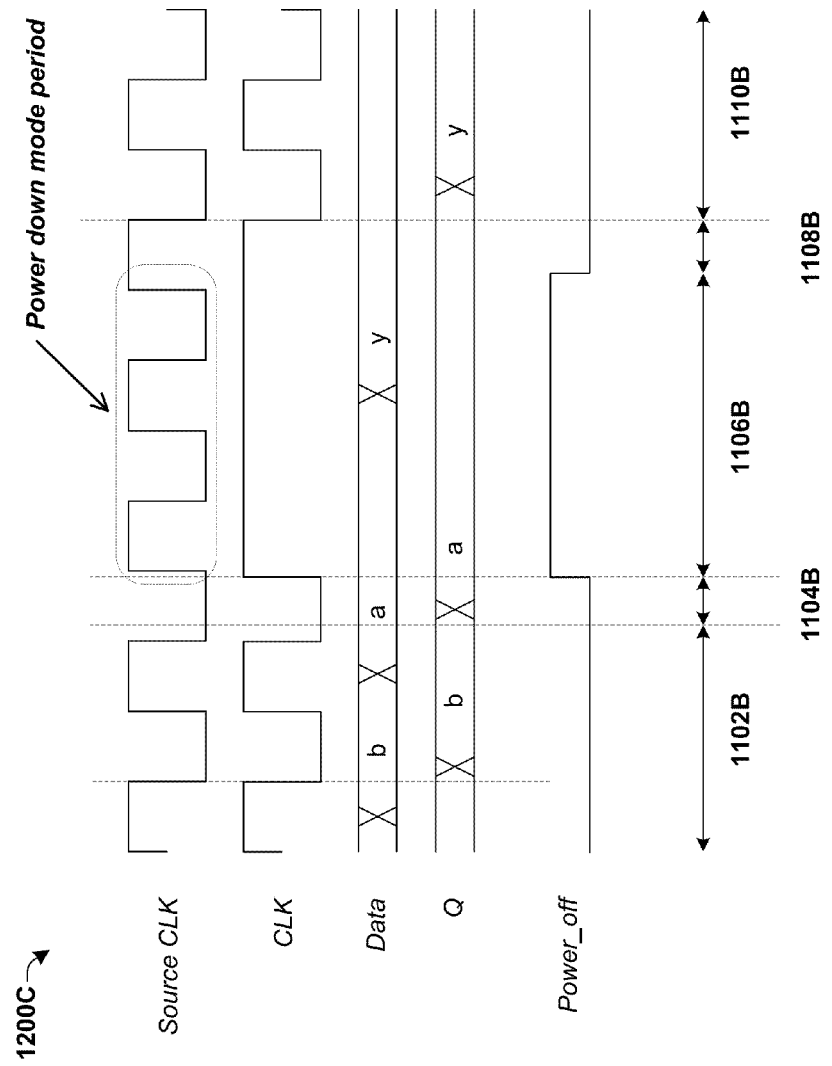

FIG. 12C illustrates a timing diagram 1200C of some embodiments of a falling edge MCML retention flip-flop comprising a low-enable slave latch comprising a power switch coupled to a master latch and a power down circuit coupled to the low-enable slave latch, wherein the Power_off signal is enabled in accordance with the method 1100B. Enabling of the Power_off signal (1104B) occurs while the Source CLK signal is low, diverting the Source CLK signal to ground, and resulting in a local CLK signal to the falling edge MCML retention flip-flop that becomes high for a duration wherein the Power_off signal remains enabled (1106B). The Power_off signal is disabled while the Source CLK signal is high (1108B) to avoid data collisions between the master latch and the slave latch.

Figure 12D:
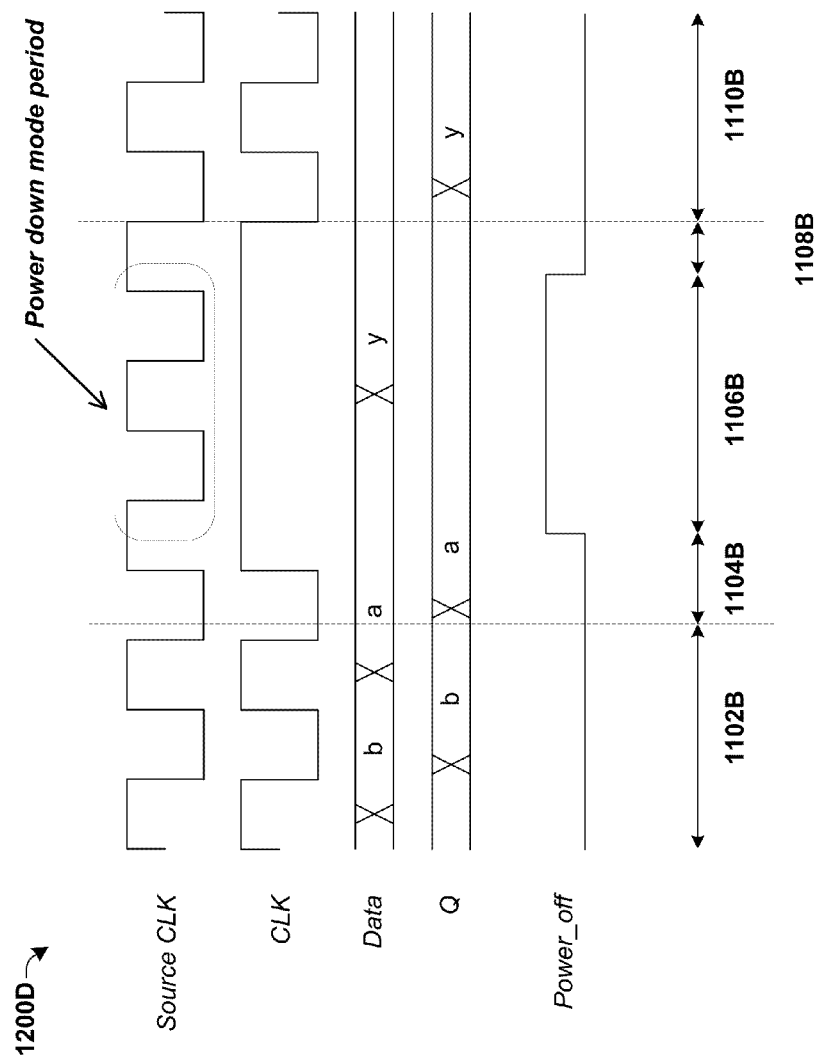

FIG. 12D illustrates a timing diagram 1200D of some embodiments of a falling edge MCML retention flip-flop comprising a low-enable slave latch comprising a power switch coupled to a master latch and a power down circuit coupled to the low-enable slave latch, wherein the Power_off signal is enabled in accordance with the method 1100B. Enabling of the Power_off signal (1104B) occurs while the Source CLK signal is high, diverting the Source CLK signal to ground, and resulting in a local CLK signal to the falling edge MCML retention flip-flop that remains high for a duration wherein the Power_off signal remains enabled (1106B). The Power_off signal is disabled while the Source CLK signal is high (1108B) to avoid data collisions between the master latch and the slave latch.

Figure 13:
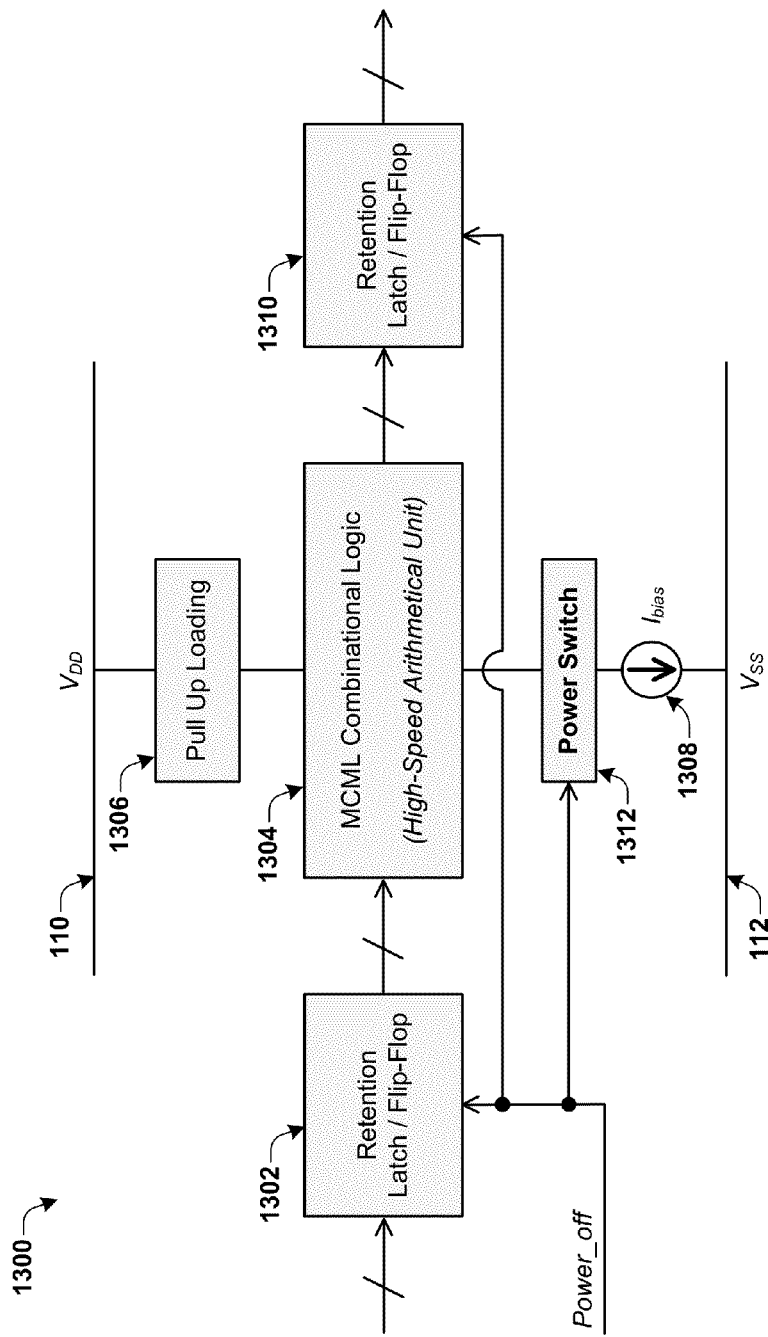
FIG. 13 illustrates some embodiments of an MCML retention latch/flip-flop application for power gating of chip components.

FIG. 13 illustrates some embodiments of an MCML retention latch/flip-flop application 1300 for power gating of chip components, wherein an input retention latch/flip-flop 1302 delivers input data to MCML combination logic 1304 comprising a high-speed arithmetical unit. The MCML combination logic 1304 is coupled to pull-up circuitry 1306 which is coupled to a voltage source $V_{DD}$ 110. The MCML combination logic 1304 is also coupled to a constant current source 1308 which is coupled to ground $V_{SS}$ 112. Output data from the MCML combination logic 1304 is sent to an output retention latch/flip-flop 1310. A first power switch (not shown) is configured to disable power to a master latch or a slave latch, respectively, of the output retention latch/flip-flop 1310 during a power off mode responsive to a Power_off signal. A second power switch 1312 is similarly configured to disable power consumption of the MCML combination logic 1304 during power off mode. In some embodiments a single power switch is configured to simultaneously disable dynamic/static power consumption to the MCML combination logic 1304 and the master latch or a slave latch, respectively. The Power_off signal further directs the pull-down circuitry coupled to the slave latch or the master latch, respectively, of a flip-flop of the one or more output registers wherein the output data resides to divert the clock signal from the slave latch or the master latch to ground during power off mode such that the output data is retained by the slave latch or the master latch, respectively. Note that for an integrated circuit (IC) comprising N MCML combinational logics (1304), the reduction in dynamic/static power consumption will be N/(N+2).

Figure 14:
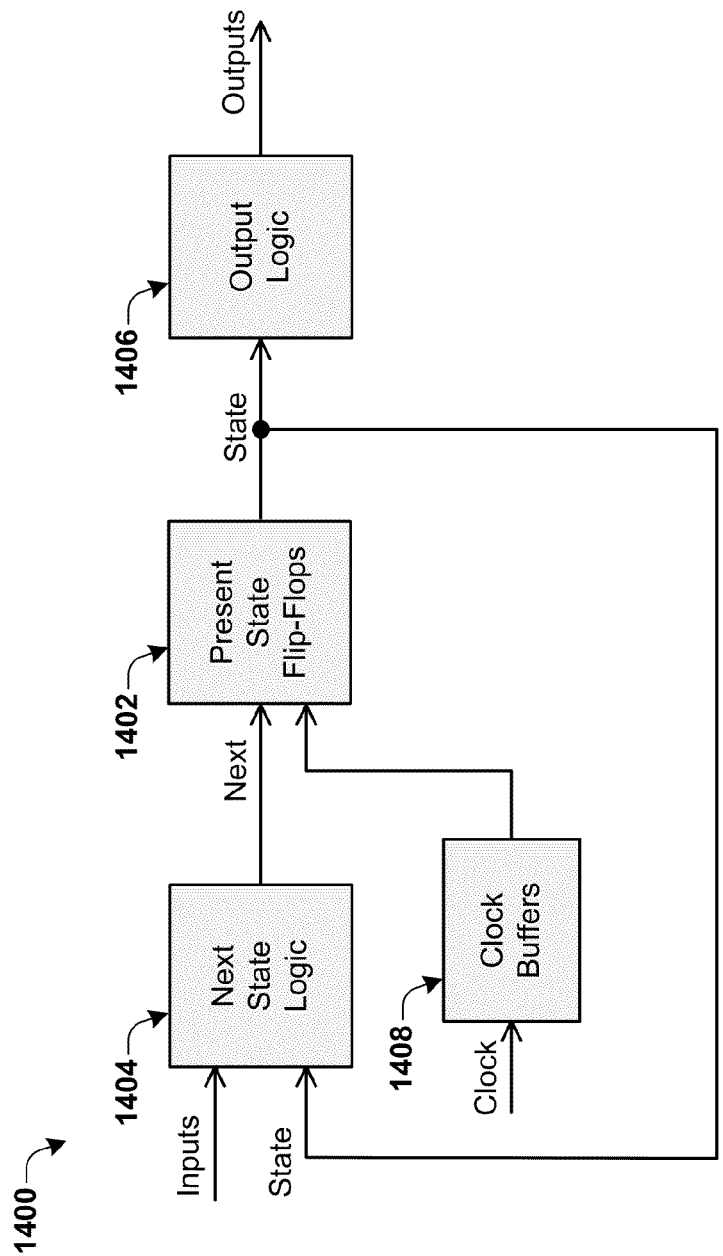
FIG. 14 illustrates some embodiments of an MCML retention latch/flip-flop application for power gating of chip logic and clock buffers.

FIG. 14 illustrates some embodiments of an MCML retention latch/flip-flop application 1400 for power gating of chip logic and clock buffers, wherein an MCML retention latch/flip-flop 1402 is configured to retain FSM states, while power gating a first MCML combinational logic segment 1404 and a second MCML combinational logic segment 1406, as well as clock buffers 1408 on clock tree paths to reduce the dynamic/static power consumption during a power off mode. In some embodiments a single power switch (not shown) is coupled to the clock buffers, the first MCML combinational logic segment 1404, and the second MCML combinational logic segment 1406, and is configured to disable power consumption simultaneously during power down mode.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method to reduce the dynamic/static power consumption of an MCML logic device. In order to retain register contents during power off mode, an MCML retention latch and flip-flop are disclosed. Retention Latch circuits in MCML architecture are used to retain critical register contents during power off mode, wherein combination logic including clock buffers on the clock tree paths are powered off to reduce dynamic/static power consumption. The MCML retention flip-flop comprises a master latch and a slave latch, wherein a power switch is added to the master latch to power the master latch off during power off mode. The slave latch includes pull-down circuits that remain active to enable the slave latch to retain data at a proper voltage level during power off mode.

In some embodiments a retention flip-flop is disclosed, the retention flip-flop comprising a master latch configured to receive an input data to the retention flip-flop and a slave latch configured to receive an intermediate output data of the master latch. A power switch is coupled to the master latch or the slave latch, respectively, is and configured to disable current flow from a constant current source to disable power consumption of the master latch or the slave latch, respectively, responsive to a power off signal during a power off mode of the retention flip-flop. The retention flip-flop further comprises pull-down circuitry coupled to the slave latch or the master latch, respectively, and configured to receive the power off signal, wherein the power off signal directs pull-down circuitry to divert the clock signal from the slave latch or the master latch, respectively, to ground during power off mode.

In some embodiments a retention latch is disclosed, the retention latch comprising pull-down circuitry coupled to a clock signal input to the retention latch and configured to receive a power off signal, wherein the power off signal directs pull-down circuitry to divert the clock signal from the retention latch to ground during power off mode, and wherein the pull-down circuitry is further configured to enable the retention latch to maintain stored data at a constant voltage level during power off mode.

In some embodiments a method to power on and power off a retention flip-flop is disclosed. Chip logic and registers are operated in a normal mode, wherein one or more input registers deliver input data to a chip logic segment responsive to a clock signal, chip logic operates on the input data, and the chip logic segment sends output data to one or more output registers, wherein an output register comprises the retention flip-flop. Chip logic and registers are then operated in a power off mode, comprising enabling a power off signal after the output data stabilizes irrespective of a clock level to direct pull-down circuitry coupled to the slave latch or the master latch, respectively, of the retention flip-flop wherein the output data resides to divert the clock signal from the slave latch or the master latch to ground during power off mode. The output data is retained in the slave latch or the master latch, respectively, as the clock level remains constant during power off mode. The power off signal is disabled and the chip logic and the registers to the normal mode of operation. The power consumption of the retention flip-flop itself can be reduced by approximately 50% by this method.

What is clamed is:

1. A retention flip-flop, comprising:
    a master latch comprising a first cross-coupled transistor structure and configured to receive and to retain input data in response to a rising or falling edge of a first buffered clock signal and further configured to provide intermediate output data based on the input data;
    a slave latch comprising a second cross-coupled transistor structure and configured to receive and to retain the intermediate output data from the master latch in response to a falling or rising edge of a second buffered clock signal;
    a power switch coupled to one of the master latch or the slave latch but not the other of the master latch or slave latch, and configured to reduce power consumption of the one of the master latch or the slave latch, in response to a power off signal; and
    pull-down circuitry coupled to the other of the master latch or slave latch but not the one of the master latch or slave latch, and configured to pull down the first or second buffered clock signal to a low logic state, which enables the master latch or the slave latch to retain a stored data state, in response to the same power off signal as provided to the one of the master latch or slave latch.

2. The retention flip-flop of claim 1, wherein the pull-down circuitry is further configured to enable the slave latch or master latch to maintain the stored data state at a constant voltage level when the power off signal is enabled.

3. The retention flip-flop of claim 2, wherein the power switch is coupled to the master latch and the pull-down circuitry is coupled to the slave latch.

4. The retention flip-flop of claim 2, wherein the pull-down circuitry is coupled to the master latch and the power switch is coupled to the slave latch.

5. The retention flip-flop of claim 1, wherein the pull-down circuitry is coupled to an input node of the master or slave latch that receives the first or second buffered clock signal, and the pull-down circuitry is configured to connect the input node to ground.

6. The retention flip-flop of claim 5, wherein the pull-down circuitry comprises an n-type field-effect transistor (NFET) having a source terminal of the NFET coupled to the input node, a drain terminal of the NFET coupled to ground, and a gate terminal of the NFET configured to receive the power off signal.

7. The retention flip-flop of claim 1, wherein:
the first buffered clock signal or the second buffered clock signal is coupled to an input node of the master latch or the slave latch; and
the pull-down circuitry is configured to connect the input node to a ground terminal.

8. The retention flip-flop of claim 1, wherein the power switch is configured to pull a node in the one of the master latch or the slave latch to ground in response to the power off signal.

9. The retention flip-flop of claim 1, wherein the other of the master or slave latch comprises a first pair of cross-coupled MOS current-mode (MCM) inverters.

10. The retention flip-flop of claim 9, wherein a first inverter within the first pair of cross-coupled MCM inverters comprises:
a current element arranged on a current path extending between a branch-point and a first DC supply node;
a first current leg extending between the branch-point and a second DC supply node, the first current leg including a first resistive element in series with a first transistor and having a first output node between the first resistive element and the first transistor, wherein the first output node is coupled to a first input of a second inverter of the first pair of cross-coupled MCM inverters; and
a second current leg extending between the branch-point and the second DC supply node and in parallel with the first current leg, the second current leg including a second resistive element in series with a second transistor and having a second output node between the second resistive element and the second transistor, wherein the second output node is coupled to a second input of the second inverter of the first pair of cross-coupled MCM inverters.

11. The retention flip-flop of claim 10, wherein the first current leg further comprises a third transistor coupled between the first transistor and the branch-point.

12. The retention flip-flop of claim 11, wherein the first buffered clock signal is provided to a gate of the third transistor.

13. The retention flip-flop of claim 11, wherein the pull-down circuitry is coupled to a gate of the third transistor and configured to selectively pull the gate of the third transistor to the first DC supply node based on the power off signal.

14. The retention flip-flop of claim 1, wherein the one of the master or slave latch comprises:
a second pair of cross-coupled MOS current-mode (MCM) inverters.

15. The retention flip-flop of claim 14, wherein a first inverter within the second pair of cross-coupled MCM inverters comprises:
a current element arranged on a current path extending between a branch-point and a first DC supply node;
a first current leg extending between the branch-point and a second DC supply node, the first current leg including a first resistive element in series with a first transistor and having a first output node between the first resistive element and the first transistor, wherein the first output node is coupled to a first input of a second inverter of the second pair of cross-coupled MCM inverters; and
a second current leg extending between the branch-point and the second DC supply node and in parallel with the first current leg, the second current leg including a second resistive element in series with a second transistor and having a second output node between the second resistive element and the second transistor, wherein the second output node is coupled to a second input of the second inverter of the second pair of cross-coupled MCM inverters.

16. The retention flip-flop of claim 15, wherein the power switch is coupled between the branch-point and the first DC supply node and is configured to selectively couple the branch-point to the first DC supply node based on the power off signal.

17. A retention flip-flop, comprising:
a clock buffer configured to produce a buffered clock signal based upon a clock signal;
a first latch comprising a first pair of cross-coupled MOS current-mode (MCM) inverters and configured to receive the buffered clock signal at an input node;
a second latch comprising a second pair of cross-coupled MCM inverters configured to receive and to retain data in response to a falling or rising edge of a second buffered clock signal, wherein the first and second latches form a slave and master pair of the retention flip-flop;
a first power switch coupled to the clock buffer and configured to selectively reduce power consumption by the clock buffer in response to a power off signal; and
pull-down circuitry coupled to the input node of the first latch, and configured selectively couple the input node to a ground terminal in response to the same power off signal as provided to the first power switch.

18. The retention flip-flop of claim 17, further comprising:
a second power switch coupled to the second latch, and configured to reduce power consumption of the second latch in response to the power off signal.

19. The retention flip-flop of claim 18, wherein the second power switch is coupled to one of the first latch or second latch but not the other of the first latch or second latch, and wherein the pull-down circuitry is coupled to the other of the first latch or second latch but not the one of the first latch or second latch.

20. The retention flip-flop of claim 17, wherein a first inverter within the first pair of cross-coupled MCM inverters comprises:
a current element arranged on a current path extending between a branch-point and a first DC supply node;
a first current leg extending between the branch-point and a second DC supply node, the first current leg including a first resistive element in series with a first transistor and having a first output node between the first resistive element and the first transistor, wherein the first output node is coupled to a first input of a second inverter of the first pair of cross-coupled MCM inverters; and
a second current leg extending between the branch-point and the second DC supply node and in parallel with the first current leg, the second current leg including a second resistive element in series with a second transistor and having a second output node between the second resistive element and the second transistor, wherein the second output node is coupled to a second input of the second inverter of the first pair of cross-coupled MCM inverters.

* * * * *